(12) United States Patent
Negishi

(10) Patent No.: US 7,932,517 B2
(45) Date of Patent: Apr. 26, 2011

(54) SEMICONDUCTOR DEVICE COMPRISING CIRCUIT SUBSTRATE WITH INSPECTION CONNECTION PADS AND MANUFACTURING METHOD THEREOF

(75) Inventor: Yuji Negishi, Kunitachi (JP)

(73) Assignee: Casio Computer Co., Ltd., Tokyo (JP)

( * ) Notice: Subject to any disclaimer, the term of this patent is extended or adjusted under 35 U.S.C. 154(b) by 148 days.

(21) Appl. No.: 12/079,259

(22) Filed: Mar. 26, 2008

(65) Prior Publication Data
US 2008/0237589 A1    Oct. 2, 2008

(30) Foreign Application Priority Data

Mar. 29, 2007    (JP) ................................. 2007-087662

(51) Int. Cl.
H01L 23/58    (2006.01)
(52) U.S. Cl. ........... 257/48; 257/700; 257/687; 257/777
(58) Field of Classification Search .................... 257/48, 257/635, 700, 777; 438/107–109
See application file for complete search history.

(56) References Cited

U.S. PATENT DOCUMENTS

| | | | |
|---|---|---|---|
| 5,986,460 | A | 11/1999 | Kawakami |
| 6,060,778 | A * | 5/2000 | Jeong et al. .................... 257/710 |
| 6,288,346 | B1 * | 9/2001 | Ojiri et al. ...................... 174/260 |
| 7,087,988 | B2 * | 8/2006 | Hosomi ........................ 257/686 |
| 7,151,010 | B2 * | 12/2006 | Nguyen et al. ................ 438/107 |
| 2002/0158318 | A1 | 10/2002 | Chen |
| 2006/0090931 | A1 | 5/2006 | Hashimoto |
| 2006/0103003 | A1 * | 5/2006 | Heide et al. .................... 257/700 |
| 2006/0226527 | A1 * | 10/2006 | Hatano et al. .................. 257/686 |
| 2007/0138619 | A1 * | 6/2007 | Shinagawa et al. ........... 257/700 |
| 2008/0239686 | A1 * | 10/2008 | Negishi ........................ 361/783 |

FOREIGN PATENT DOCUMENTS

JP    11-17057 A    1/1999

(Continued)

OTHER PUBLICATIONS

The International Search Report and the Written Opinion of the International Searching Authority dated Aug. 22, 2008, issued in a counterpart International Application. 16 sheets.

Chinese Office Action dated Jun. 2, 2010 and English translation thereof, issued in counterpart Chinese Application No. 200880004282.5.

(Continued)

*Primary Examiner* — Wai-Sing Louie
*Assistant Examiner* — Sue Tang
(74) *Attorney, Agent, or Firm* — Holtz, Holtz, Goodman & Chick, PC

(57) ABSTRACT

A semiconductor device includes a first circuit substrate having a plurality of lower wiring lines and a plurality of upper wiring lines on the lower surface side and upper surface side thereof, respectively. A second circuit substrate is provided on a lower side of the first circuit substrate, the second circuit substrate having an opening which exposes part of the first circuit substrate, the second circuit substrate also having, on the lower surface side thereof, a plurality of external-connection connection pads and a plurality of test connection pads connected to the lower wiring lines. A first semiconductor construct is disposed on the lower side of the first circuit substrate within the opening of the second circuit substrate, the first semiconductor construct having a plurality of external connection electrodes connected to the lower wiring lines. A third circuit substrate and/or an electronic component is provided on an upper side of the first circuit substrate and connected to the upper wiring lines.

22 Claims, 14 Drawing Sheets

FOREIGN PATENT DOCUMENTS

| | | |
|---|---|---|
| JP | 2004-22664 A | 1/2004 |
| JP | 2004-64043 A | 2/2004 |
| JP | 2004-207306 A | 7/2004 |
| JP | 2004-281633 A | 10/2004 |
| WO | WO 2005/071743 A1 | 8/2005 |

OTHER PUBLICATIONS

Japanese Office Action dated Sep. 7, 2010 (and English translation thereof) in counterpart Japanese Application No. 2007-087662.

* cited by examiner

SEMICONDUCTOR DEVICE COMPRISING CIRCUIT SUBSTRATE WITH INSPECTION CONNECTION PADS AND MANUFACTURING METHOD THEREOF

CROSS-REFERENCE TO RELATED APPLICATIONS

This application is based upon and claims the benefit of priority from prior Japanese Patent Application No. 2007-087662, filed Mar. 29, 2007, the entire contents of which are incorporated herein by reference.

BACKGROUND OF THE INVENTION

1. Field of the Invention

This invention relates to a semiconductor device comprising a circuit substrate with inspection connection pads and a manufacturing method thereof.

2. Description of the Related Art

Jpn. Pat. Appln. KOKAI Publication No. 2004-207306 discloses a semiconductor device in which a semiconductor construct having a semiconductor substrate and a plurality of external connection electrodes provided on the semiconductor substrate is installed on a substrate having a planar size larger than that of the semiconductor construct. The semiconductor construct described in this patent document further has external connection columnar electrodes which are connected to connection pads of an integrated circuit unit formed on the surface of the semiconductor substrate and which are to be connected to an external circuit or device, and a sealing film filled between the columnar electrodes. The semiconductor construct is installed on the substrate, and an insulating layer is provided on the substrate around the semiconductor construct. An upper insulating film is provided on the semiconductor construct and the insulating layer. An upper wiring substrate including upper wiring lines electrically connected to the columnar electrodes of the semiconductor construct is provided on the upper insulating film. Solder balls are provided on connection pad portions of the upper wiring lines.

In the semiconductor device described in the above-mentioned patent document, the semiconductor construct has the columnar electrodes and the sealing film filled between the columnar electrodes, which allows the semiconductor construct and the upper wiring substrate to be securely joined together and also allows the columnar electrodes and the upper wiring lines to be electrically connected together in a firm and reliable way.

As the semiconductor construct of the conventional semiconductor device described above is structured to be sealed by the substrate, the insulating layer disposed therearound and the upper wiring substrate disposed thereover, it is not possible to inspect this device until the upper wiring lines having the connection pad portions are formed, that is, until the device is completed. There is thus a disadvantage that it is difficult to repair defective products and that the yield ratio aggravates.

Moreover, the conventional semiconductor device has a structure in which the connection pad portions of the upper wiring lines to be connected to the external circuit or device are only exposed and no connection pads exclusive to an inspection are exposed, so that it is absolutely impossible to inspect the integrated circuit unit contained in the semiconductor construct incorporated in the semiconductor device. In addition, when another electronic component such as a semiconductor construct is further installed on the upper wiring substrate, the connection pad portions of the upper wiring lines are covered with this electronic component, so that it is not at all possible to conduct an inspection when this semiconductor construct is installed.

BRIEF SUMMARY OF THE INVENTION

This invention is directed to provide a semiconductor device and a manufacturing method thereof in which, when a semiconductor construct and a wiring substrate are in a mounted state, this mounted state can be inspected or an integrated circuit unit contained in the mounted semiconductor construct can be inspected.

A semiconductor device according to one aspect of this invention comprising:

a first circuit substrate having a plurality of lower wiring lines and a plurality of upper wiring lines on the lower surface side and upper surface side thereof, respectively;

a second circuit substrate provided on a lower side of the first circuit substrate, the second circuit substrate having an opening which exposes part of the first circuit substrate, the second circuit substrate also having, on the lower surface side thereof, a plurality of external-connection connection pads and a plurality of test connection pads connected to the lower wiring lines;

a first semiconductor construct which is disposed on the lower side of the first circuit substrate within the opening of the second circuit substrate, the first semiconductor construct having a plurality of external connection electrodes connected to the lower wiring lines; and a third circuit substrate and/or an electronic component provided on an upper side of the first circuit substrate and connected to the upper wiring lines.

A method for manufacturing a semiconductor device according to another aspect of this invention comprising:

preparing a first circuit substrate having upper wiring lines and lower wiring lines;

installing a first semiconductor construct under the first circuit substrate so that the first semiconductor construct is connected to the lower wiring lines of the first circuit substrate;

disposing a second circuit substrate under the first circuit substrate, the second circuit substrate having an opening which receives the first semiconductor construct, the second circuit substrate also having, on the lower surface side thereof, external-connection connection pads and test connection pads connected to the lower wiring lines of the first circuit substrate; and disposing a third circuit substrate over the first circuit substrate, the third circuit substrate having lower wiring lines connected to the upper wiring lines of the first circuit substrate and upper wiring lines connected to these lower wiring lines.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
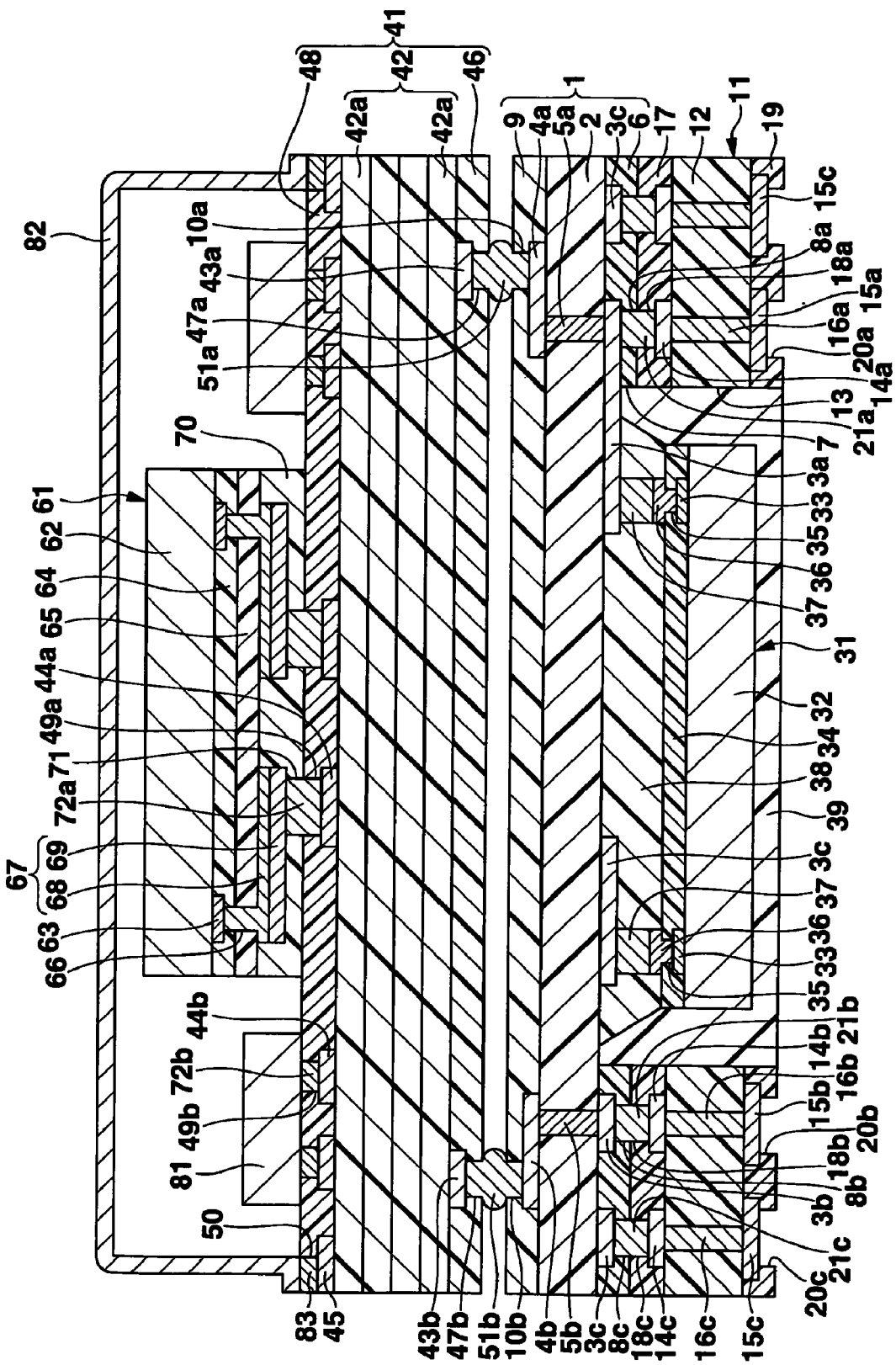
FIG. 1 is a sectional view of a semiconductor device as a first embodiment of this invention.

FIG. 1 shows a sectional view of a semiconductor device as a first embodiment of this invention. The entire configuration of this semiconductor device is briefly described. A square frame-shaped lower circuit substrate (second circuit substrate) 11 is provided in the peripheral portion of the lower surface of a planar square circuit substrate (first circuit substrate) 1. A semiconductor construct 31 which has, for example, a base band IC (BBIC) and which configures a digital system circuit unit together with an unshown electronic component is installed in the center of the lower surface of the circuit substrate 1. A planar square upper circuit substrate (third circuit substrate) 41 is provided on the upper surface of the circuit substrate 1. A semiconductor construct 61 which has, for example, a radio frequency IC (RFIC) and which configures an analog system circuit unit together with a chip component (electronic component) 81 is installed on the upper surface of the upper circuit substrate 41.

The respective members are explained in further detail. The circuit substrate 1 is first described. The circuit substrate 1 comprises a planar square film substrate 2 made of an electrically insulating material such as a polyimide-based resin. A plurality of first, second and third lower wiring lines 3a, 3b and 3c are provided on the lower surface of the film substrate 2, and a plurality of first and second upper wiring lines 4a and 4b are provided on the upper surface thereof. The functions of these upper and lower wiring lines 3a, 3b, 3c, 4a and 4b are described later. All wiring lines 3a, 3b, 3c, 4a and 4b are formed by, for example, metal foils made of a metal such as a copper-based or aluminum-based metal. The first lower wiring line or lines 3a and the first upper wiring line or lined 4a are electrically connected to each other via a first vertical conductor or conductors 5a which are made of a metal paste or a conductive pin and which is provided within the film substrate 2. The second lower wiring line or lines 3b and the second upper wiring line or lines 4b are electrically connected to each other via a second vertical conductor or conductors 5b provided within the film substrate 2.

A square frame-shaped lower overcoat film 6 made of, for example, a solder resist is provided on the peripheral portion of the lower surface of the film substrate 2. The lower overcoat film 6 partly or entirely covers the first to third lower wiring lines 3a to 3c formed on the peripheral portion of the lower surface of the film substrate 2 (some of the plurality of lower wiring lines 3a located in the central part are not covered). The lower overcoat film 6 is provided with a central square opening 7 which exposes the center of the lower surface of the film substrate 2. First, second and third openings 8a, 8b, 8c are formed in the lower overcoat film 6 in parts corresponding to connection pad portions of the first, second and third lower wiring lines 3a, 3b and 3c. An upper overcoat film 9 made of, for example, a solder resist is provided, preferably entirely, on the upper surface of the film substrate 2. The upper overcoat film 9 covers the first and second upper wiring lines 4a and 4b. First and second openings 10a and 10b are formed in the upper overcoat film 9 in parts corresponding to connection pad portions of the first and second upper wiring lines 4a and 4b.

The lower circuit substrate 11 having a square frame-shaped substrate 12 whose planar shape is substantially the same as that of the lower overcoat film 6 is provided on the square frame-shaped lower overcoat film 6 provided on the lower surface of the circuit substrate 1. The substrate 12 is made of, for example, an insulating material such as a material in which a thermosetting resin made of, for example, an epoxy-based resin is impregnated into a base material made of, for example, glass fabric. Square frame-shaped overcoat films 17, 19 produced by a method described later are formed on the upper and lower surfaces of the substrate 12. In other words, the lower circuit substrate 11 is formed by a stack of the substrate 12 and the overcoat films 17, 19, and is provided with a square opening 13 in a part corresponding to the opening 7 of the lower overcoat film 6 of the circuit substrate 1.

A plurality of first, second and third upper connection pads 14a, 14b and 14c are provided on the upper surface of the substrate 12, and a plurality of first, second and third lower connection pads 15a, 15b and 15c are provided on the lower surface thereof. These connection pads 14a to 14c and 15a to 15c are formed by, for example, metal foils made of a metal such as a copper-based or aluminum-based metal. The first upper connection pad 14a and the first lower connection pad 15a, the second upper connection pad 14b and the second lower connection pad 15b, and the third upper connection pad 14c and the third lower connection pad 15c are electrically connected to each other via first, second and third vertical conductors 16a, 16b and 16c which are made of, for example, a metal paste or conductive pins and which are provided within the substrate 12. In addition, although described later, the electric connection between the first to third upper connection pads 14a to 14c and the first to third lower connection pads 15a to 15c shown in FIG. 1 is as described above, but the first to third upper connection pads 14a to 14c and the first to third lower connection pads 15a to 15c are also connected to each other in connection pad portions of wiring lines which are not shown in FIG. 1, and FIG. 1 only shows one example of connection.

The upper overcoat film 17 provided on the upper surface of the substrate 12 covers the peripheral surfaces or side surfaces and upper surfaces of the first, second and third upper connection pads 14a, 14b, 14c, and is provided with first, second and third openings 18a, 18b, 18c in parts corresponding to the centers of the first, second and third upper connection pads 14a, 14b, 14c. The lower overcoat film 19 provided on the lower surface of the substrate 12 covers the peripheral surfaces or side surfaces and lower surfaces of the first, second and third lower connection pads 15a, 15b, 15c, and is provided with first, second and third openings 20a, 20b, 20c in parts corresponding to the centers of the first, second and third lower connection pads 15a, 15b, 15c.

The first to third upper connection pads 14a to 14c are respectively joined to the connection pad portions of the first to third lower wiring lines 3a to 3c of the circuit substrate 1 via first, second and third solder layers 21a, 21b, 21c provided in the parts of the first to third openings 18a to 18c of the upper overcoat film 17 or in the parts of the first to third openings 8a to 8c of the lower overcoat film 6 of the circuit substrate 1, such that the lower circuit substrate 11 is disposed on the lower surface of the lower overcoat film 6 of the circuit substrate 1.

The semiconductor construct 31 is installed in the center of the lower surface of the film substrate 2 of the circuit substrate 1 within the opening 13 of the lower circuit substrate 11 and within the opening 7 of the lower overcoat film 6 of the circuit substrate 1. The semiconductor construct 31 comprises a silicon substrate (semiconductor substrate) 32. An integrated circuit unit (not shown) composed of digital circuits with predetermined functions is provided on the upper surface (principal surface) of the silicon substrate 32, and a plurality of connection pads 33 made of, for example, an aluminum-based metal are provided in the peripheral portion of the upper surface of the silicon substrate 32 so that these connection pads are electrically connected to the integrated circuit unit.

An insulating film 34 made of, for example, silicon oxide is provided on the upper surfaces of the connection pads 33 except for their centers and on the upper surface of the silicon substrate 32, and the centers of the connection pads 33 are exposed via openings 35 provided in the insulating film 34. The state comprising the silicon substrate 32, the connection pads 33 and the insulating film 34 is obtained by dicing from a wafer state, and is generally called a bare IC chip. The semiconductor construct 31 is such a bare IC chip provided with projecting electrodes for external connection. That is, a foundation metal layer 36 made of a metal such as a copper-based or aluminum-based metal is provided on the upper surfaces of the connection pads 33 exposed via the openings 35 of the insulating film 34 and on the upper surface of the insulating film 34 around the connection pads 33. A projecting electrode or columnar electrode 37 made of a conductor such as gold is provided on the entire upper surface of the foundation metal layer 36. The foundation metal layer 36, the columnar electrode 37 and the connection pad 33 constitute an external connection electrode. The insulating film 34 may be formed as a stacked structure of an inorganic insulating film such as silicon oxide and an organic insulating film such as a polyimide-based resin formed on the inorganic insulating film.

The columnar electrodes 37 of the semiconductor construct 31 are Au—Au-joined or Au—Sn-joined to Ni—Au plated films or Sn plated films (not shown) provided on the surfaces of the connection pad portions of the first and third lower wiring lines 3a, 3c of the circuit substrate 1, such that the semiconductor construct 31 is installed face down in the center of the lower surface of the film substrate 2 of the circuit substrate 1 within the opening 13 of the lower circuit substrate 11 and within the opening 7 of the lower overcoat film 6 of the circuit substrate 1. In this state, the lower surface of the lower overcoat film 19 of the lower circuit substrate 11 is located lower than the lower surface (bottom surface) of the silicon substrate 32 of the semiconductor construct 31.

An underfill material 38 made of a thermosetting resin such as an epoxy-based resin is provided in a space between the semiconductor construct 31 and the film substrate 2 including the first and third lower wiring lines 3a, 3c of the circuit substrate 1, and around this space. A sealing film 39 made of a thermosetting resin such as an epoxy-based resin is provided within the opening 13 of the lower circuit substrate 11 and within the opening 7 of the lower overcoat film 6 of the circuit substrate 1, and this sealing film 39 covers the semiconductor construct 31, the underfill material 38 and the film substrate 2. The lower surface of the sealing film 39 is flush with or located higher than (recessed relative to) the lower surface of the lower overcoat film 19 of the lower circuit substrate 11.

Figure 2:
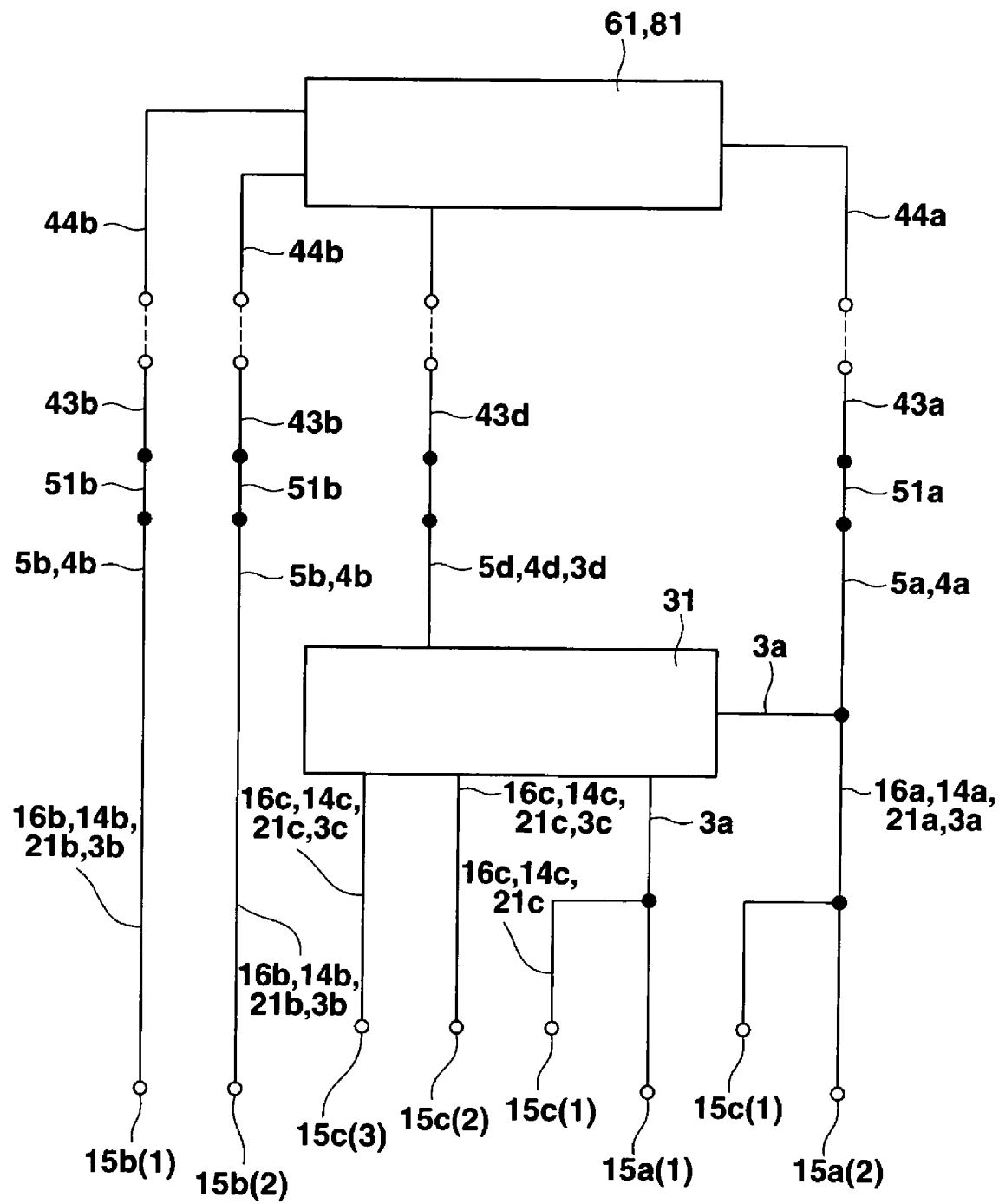
FIG. 2 is a schematic circuit diagram of part of the semiconductor device shown in FIG. 1.

The connection and functions (applications) of the first to third lower connection pads 15a to 15c of the lower circuit substrate 11 are hereinafter described with reference to a schematic circuit diagram of part of this semiconductor device shown in FIG. 2. The first lower connection pad 15a includes an external-connection connection pad for control and data input/output 15a(1) connected to the semiconductor construct 31 incorporating the integrated circuit unit, and a power supply external-connection connection pad 15a(2). The integrated circuit unit incorporated in the semiconductor construct 31 configures, for example, a BBIC, and the first lower connection pad 15a is connected to the connection pad 33 of the semiconductor substrate 32 via the first vertical conductor 16a, the first upper connection pad 14a, the first solder layer 21a, the first lower wiring line 3a, the columnar electrode 37 and the foundation metal layer 36. In this case, the first lower wiring line 3a connected to the power supply external-connection connection pad 15a(2) is also connected to the semiconductor construct 61 and chip component 81 described later via the first vertical conductor 5a, the connection pad portions of the first upper wiring line 4a, the connection pad portion of a first lower wiring line 43a of the upper circuit substrate 41 described later, etc.

The second lower connection pad 15b includes an external-connection connection pads for control signal and data input/output 15b(1) and 15b(2) connected to the semiconductor construct 61 incorporating an integrated circuit unit described later and chip component 81. The semiconductor construct 61 incorporates, for example, an RFIC, and configures the analog system circuit unit such as an RF circuit unit together with the chip component 81, and the second lower connection pad 15b is connected to the semiconductor construct 61 and the chip component 81 via the second vertical conductor 16b, the second upper connection pad 14b, the second solder layer 21b, the second lower wiring line 3b, the second vertical conductor 5b, the second upper wiring line 4b, etc. In this case, the external-connection connection pad 15b(1) is directly connected to the external connection terminal of the semiconductor construct 61 described later, and the external-connection connection pad 15b(2) is directly connected to the external connection terminal of the chip component 81 described later. Moreover, although described later, a ground wiring line 45 connected to the semiconductor constructs 31, 61 and the chip component 81 in common is provided as shown in FIG. 1, and a ground connection pad connected to the ground wiring line 45 is also provided so that it is exposed from the lower overcoat film 19.

The third lower connection pad (test connection pad) 15c includes connection pads 15c(1), 15c(2) exclusive to the function inspection of the semiconductor construct 31, and a ground connection pad 15c(3). Some of these connection pads 15c(2), 15c(3) are connected to the connection pad 33 exclusive to the inspection of the semiconductor construct 31 via the third vertical conductor 16c, the third upper connection pad 14c, the third solder layer 21c, the third lower wiring line 3c, the columnar electrode 37 and the foundation metal layer 36. The other connection pad 15c(1) is connected to the first lower wiring line 3a halfway.

Here, although not shown in FIG. 1, part of the columnar electrode 37 of the semiconductor construct 31 is connected to the semiconductor construct 61 and the chip component 81 via a lower wiring line 3d provided in the lower circuit substrate 11, a vertical conductor 5d, an upper wiring line 4d and a lower wiring line 43d provided on the lower surface of the upper circuit substrate 41 described later.

The planar square upper circuit substrate 41 is provided on the upper surface side of the circuit substrate 1. The upper circuit substrate 41 comprises a multilayer wiring substrate 42 having a multilayer wiring structure in which a plurality of wiring substrates 42a are stacked. Although not shown, each of the wiring substrates 42a has, as is well known, an internal wiring line composed of a wiring line provided between insulating substrates and a via hole provided to penetrate the insulating substrates. A plurality of first and second lower wiring lines 43a, 43b are provided on the lower surface of the multilayer wiring substrate 42, and a plurality of first and second upper wiring lines 44a, 44b are provided on the upper surface thereof, and moreover, the square frame-shaped ground wiring line 45 is provided in the peripheral portion of the upper surface thereof. These wiring lines 43a, 43b, 44a, 44b, 45 are formed by metal foils made of a metal such as a copper-based or aluminum-based metal. The first and second lower wiring lines 43a, 43b are connected to the first and second upper wiring lines 44a, 44b and the ground wiring line 45 via internal wiring lines of the multilayer wiring substrate 42 to configure a predetermined circuit.

A lower overcoat film 46 made of, for example, a solder resist is provided on the surfaces of the first and second lower wiring lines 43a, 43b and on the lower surface of the multilayer wiring substrate 42. First and second openings 47a and 47b are provided in the lower overcoat film 46 in parts corresponding to connection pad portions of the first and second lower wiring lines 43a, 43b. An upper overcoat film 48 made of, for example, a solder resist is provided on the surfaces of the first and second upper wiring lines 44a, 44b and the ground wiring line 45 and on the upper surface of the multilayer wiring substrate 42. First and second openings 49a and 49b and an opening 50 are provided in the upper overcoat film 48 in parts corresponding to connection pad portions of the first and second upper wiring lines 44a, 44b and the outer peripheral portion of the ground wiring line 45.

Furthermore, the first and second lower wiring lines 43a, 43b of the upper circuit substrate 41 are joined to the connection pad portions of the first and second upper wiring lines 4a, 4b of the circuit substrate 1 via first and second solders 51a, 51b provided within the first and second openings 47a, 47b of the lower overcoat film 46 and within the first and second openings 10a, 10b of the upper overcoat film 9 of the circuit substrate 1, such that the upper circuit substrate 41 is disposed on the upper surface of the upper overcoat film 9 of the circuit substrate 1. In this case, the first and second solders 51a, 51b are formed to bulge out of the lower surface of the lower overcoat film 46 and the upper surface of the upper overcoat film 9 from within the first openings 47a and 10a and from within the second openings 47b and 10b so that there may be a gap between the lower surface of the lower overcoat film 46 and the upper surface of the upper overcoat film 9.

The semiconductor construct 61 is installed in the center of the upper surface of the upper overcoat film 48 of the upper circuit substrate 41, and the plurality of chip components 81 composed of condensers, resistors and others are installed in the peripheral portion of the upper surface thereof. In this case, the semiconductor construct 61 and the plurality of chip components 81 configure the analog system circuit unit. Both electrodes (not shown) of the chip components 81 are joined to the connection pad portions of the second upper wiring lines 44b via second solder layers 72b provided within the second openings 49b of the upper overcoat film 48, such that the chip components 81 are installed in the peripheral portions of the upper surface of the upper overcoat film 48 of the upper circuit substrate 41.

The semiconductor construct 61 comprises a silicon substrate (semiconductor substrate) 62. An integrated circuit unit (not shown) with a predetermined function is provided on the lower surface of the silicon substrate 62, and a plurality of connection pads 63 made of, for example, an aluminum-based metal are provided in the peripheral portion of the lower surface of the silicon substrate 62 so that these connection pads are connected to the integrated circuit unit. An insulating film 64 made of an inorganic material such as silicon oxide and a protective film 65 made of an organic resin such as a polyimide-based resin are provided on the lower surface of the silicon substrate 62 except for the centers of the connection pads 63, and the centers of the connection pads 63 are exposed via openings 66 provided in the insulating film 64 and the protective film 65.

A wiring line 67 is provided on the lower surface of the protective film 65. The wiring line 67 has a double layer structure including a foundation metal layer 68 which is made of, for example, copper and which is provided on the lower surface of the protective film 65 and an upper metal layer 69 which is made of copper and which is provided on the lower surface of the foundation metal layer 68. One end of the wiring line 67 is connected to the connection pad 63 via the opening 66 of the insulating film 64 and the protective film 65. An overcoat film 70 made of, for example, a solder resist is provided on the lower surface of the protective film 65 including the wiring line 67. An opening 71 is provided in the overcoat film 70 in a part corresponding to the connection pad portion of the wiring line 67.

Furthermore, the connection pad portions of the wiring line 67 of the semiconductor construct 61 are joined to the connection pad portions of the first upper wiring lines 44a of the upper circuit substrate 41 via first solder layers 72a provided in the parts of the openings 71 of the overcoat film 70 or in the parts of the first openings 49a of the upper overcoat film 48 of the upper circuit substrate 41, such that the semiconductor construct 61 is installed face down in the center of the upper surface of the upper overcoat film 48 of the upper circuit substrate 41.

The lower end of a shield cover 82 made of a metal is joined via a solder layer 83 to the upper surface of the outer peripheral portion of the ground wiring line 45 exposed via the opening 50 of the upper overcoat film 48 in the upper circuit substrate 41. The shield cover 82 covers the semiconductor construct 61 and the chip components 81 constituting the analog system circuit unit in order to reduce the disturbance of noise which is emitted from the semiconductor construct 31 configuring the digital system circuit unit and which is caused to the semiconductor construct 61 and the chip components 81 constituting the analog system circuit unit.

Figure 3:
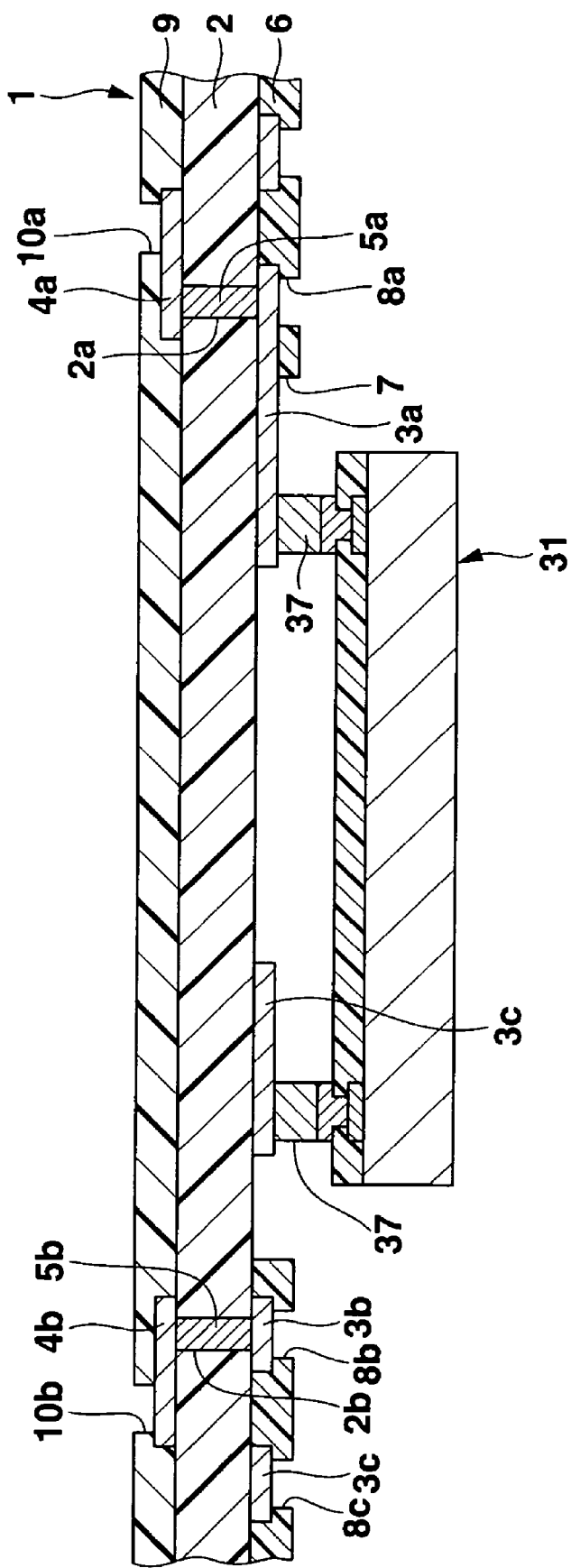
FIG. 3 is a sectional view of an assembly prepared in an initial step in one example of a method for manufacturing the semiconductor device shown in FIG. 1.

Next, one example of a method for manufacturing this semiconductor device is described. First, as shown in FIG. 3, the circuit substrate 1 is prepared. In this case, the prepared circuit substrate 1 is sized so that a plurality of completed semiconductor devices shown in FIG. 1 can be formed. A plurality of first and second through-holes 2a, 2b are formed in the film substrate 2 made of, for example, a polyimide-based resin, by, for example, laser processing based on laser irradiation.

The first and second vertical conductors 5a, 5b made of, for example, a metal paste or conductive pins are formed in the first and second through-holes 2a, 2b of the film substrate 2. The first to third lower wiring lines 3a to 3c and the first and second upper wiring lines 4a, 4b are formed on the lower and upper surfaces of the film substrate 2 by patterning stacked metal foils made of a metal such as a copper-based or aluminum-based metal. In this case, the first and second lower wiring lines 3a, 3b and the first and second upper wiring lines 4a, 4b are connected to each other via the first and second vertical conductors 5a, 5b.

The lower overcoat film 6 having the opening 7 is formed on the lower surface of the film substrate 2 including the first to third lower wiring lines 3a to 3c by depositing, for example, a solder resist through, for example, screen printing. The first to third openings 8a to 8c are formed in the lower overcoat film 6 in parts corresponding to the connection pad portions of the first to third lower wiring lines 3a to 3c by, for example, laser processing based on laser irradiation.

The upper overcoat film 9 is formed on the upper surface of the film substrate 2 including the first and second upper wiring lines 4a, 4b by depositing, for example, a solder resist through, for example, screen printing. The first and second openings 10a, 10b are formed in the upper overcoat film 9 in parts corresponding to the connection pad portions of the first and second upper wiring lines 4a, 4b by, for example, laser processing based on laser irradiation.

Now, after the circuit substrate 1 has been prepared, the projecting electrodes 37 of the semiconductor construct 31 are Au—Au-joined or Au—Sn-joined to the Ni—Au plated films or Sn plated films (not shown) provided on the surfaces of the connection pad portions of the first and third lower wiring lines 3a, 3c of the circuit substrate 1, such that the semiconductor construct 31 is installed face down on the lower surface of the film substrate 2 within the opening 7 of the lower overcoat film 6 of the circuit substrate 1, as shown in FIG. 3. In addition, the step of installing (bonding) the semiconductor construct 31 is carried out in a condition where the state shown in FIG. 3 is vertically inverted (the same applies up to the later-described step of forming the sealing film 39).

Figure 4:
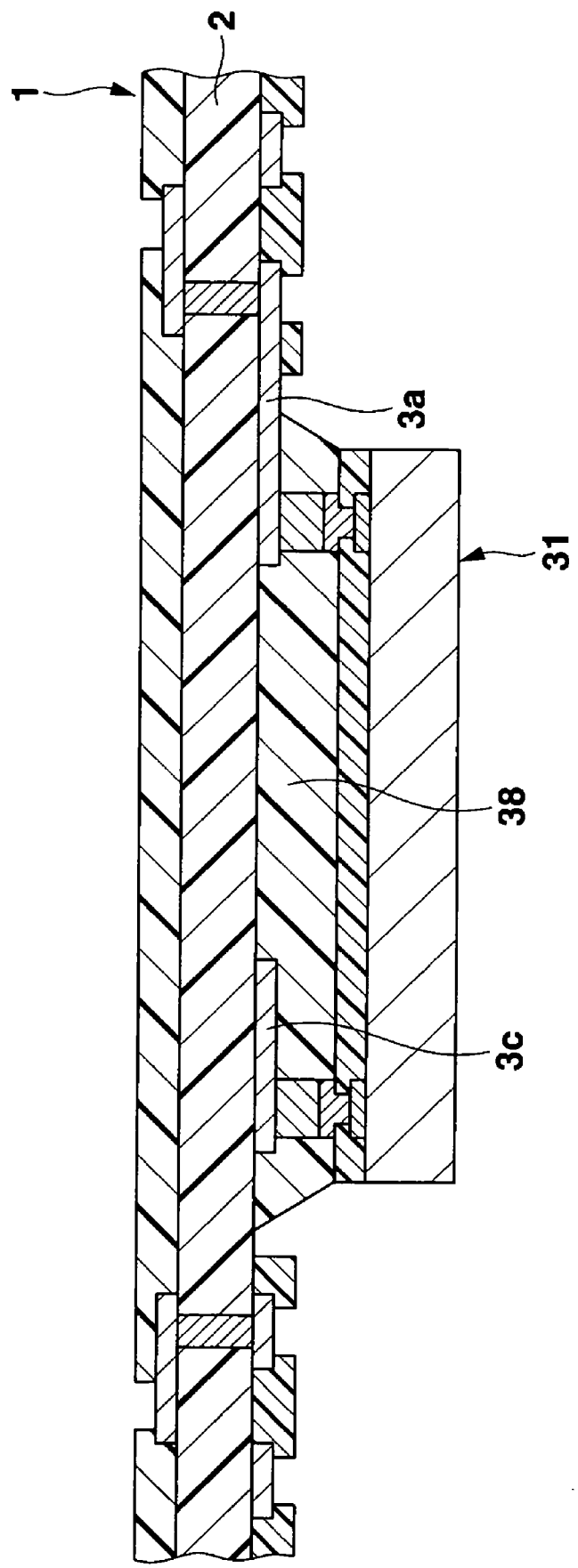
FIG. 4 is a sectional view of the assembly in a step following FIG. 3.

Then, as shown in FIG. 4, the underfill material 38 made of a thermosetting resin such as an epoxy-based resin is filled and formed by use of, for example, a dispenser in a space between the semiconductor construct 31 and the film substrate 2 including the first and third lower wiring lines 3a, 3c of the circuit substrate 1, and around this space.

Figure 5:
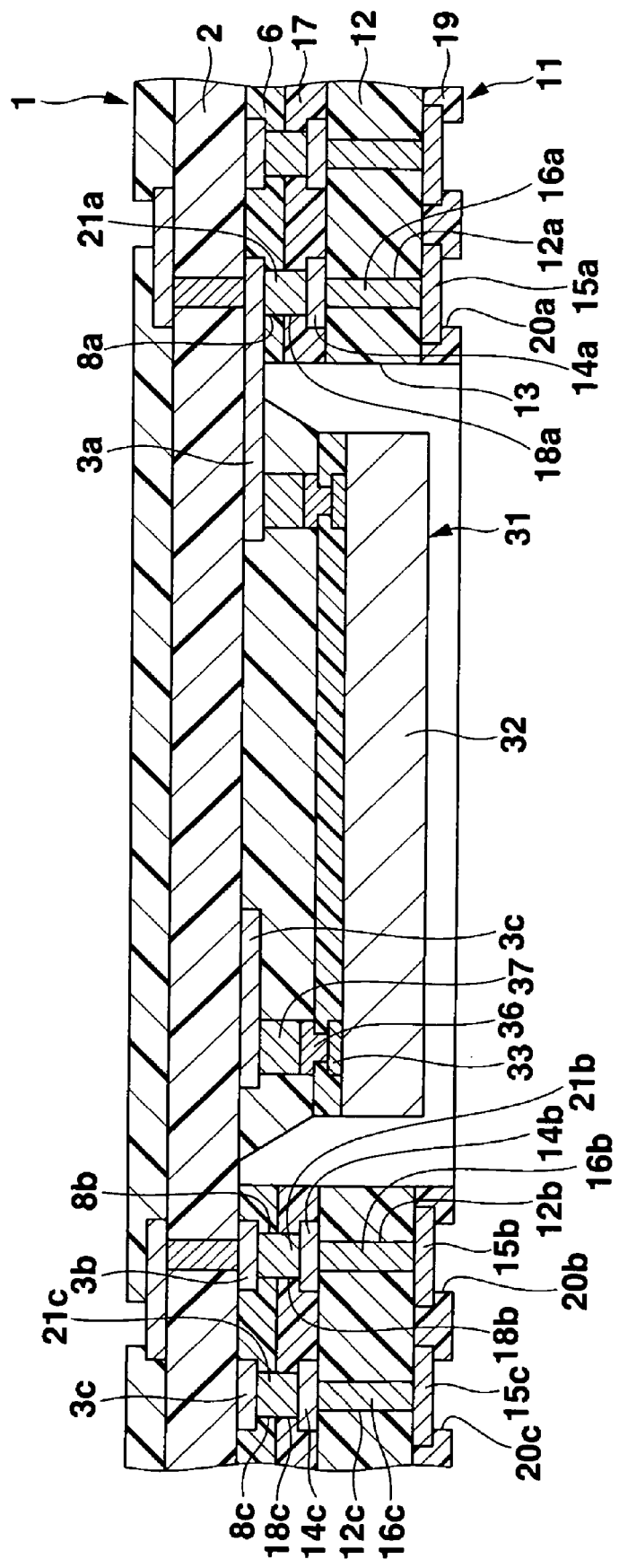
FIG. 5 is a sectional view of the assembly in a step following FIG. 4.

Then, as shown in FIG. 5, the lower circuit substrate 11 is prepared. In this case as well, the prepared lower circuit substrate 11 is sized so that a plurality of completed semiconductor devices shown in FIG. 1 can be formed. The substrate 12 is formed as follows: A thermosetting resin such as an epoxy-based resin is impregnated into a base material made of, for example, glass fabric, and the thermosetting resin is cured into a sheet shape. A plurality of square openings 13 are formed therein by, for example, punching, and a plurality of first to third through-holes 12a to 12c are formed by, for example, laser processing based on laser irradiation.

The first to third vertical conductors 16a to 16c made of, for example, a metal paste or conductive pins are formed in the first to third through-holes 12a to 12c of the substrate 12. The first to third upper connection pads 14a to 14c and the first to third lower connection pads 15a to 15c are formed on the upper and lower surfaces of the substrate 12 by patterning stacked metal foils made of a metal such as a copper-based or aluminum-based metal so that they are connected to each other via the first to third vertical conductors 16a to 16c.

The upper overcoat film 17 having the openings 13 is formed on the upper surface of the substrate 12 including the first to third upper connection pads 14a to 14c by depositing a solder resist through, for example, screen printing. The first to third openings 18a to 18c are formed in the upper overcoat film 17 in parts corresponding to the first to third upper connection pads 14a to 14c by, for example, laser processing based on laser irradiation.

The lower overcoat film 19 having the openings 20a to 20c is formed on the lower surface of the substrate 12 including the first to third lower connection pads 15a to 15c by depositing a solder resist through, for example, screen printing. The first to third openings 20a to 20c are formed in the lower overcoat film 19 in parts corresponding to the first to third lower connection pads 15a to 15c by, for example, laser processing based on laser irradiation.

Now, after the lower circuit substrate 11 has been prepared, the first to third upper connection pads 14a to 14c of the lower circuit substrate 11 are joined to the connection pad portions of the first to third lower wiring lines 3a to 3c of the circuit substrate 1 via the first to third solder layers 21a to 21c provided in the parts of the first to third openings 18a to 18c of the upper overcoat film 17 of the lower circuit substrate 11 or in the parts of the first to third openings 8a to 8c of the lower overcoat film 6 of the circuit substrate 1, such that the lower circuit substrate 11 is disposed on the lower surface of the lower overcoat film 6 of the circuit substrate 1, as shown in FIG. 5.

In order to join the first to third upper connection pads 14a to 14c of the lower circuit substrate 11 to the connection pad portions of the first to third lower wiring lines 3a to 3c of the circuit substrate 1, a reflow method which carries out soldering with a solder reflow device can be applied. For example, the upper and lower surfaces of the circuit substrate 1 on which the semiconductor construct 31 is installed are inverted from the state shown in FIG. 4, that is, the surface on which the semiconductor construct 31 is installed is directed upward. The solder layers are deposited on the connection pad portions of the first to third lower wiring lines 3a to 3c of the circuit substrate 1 by, for example, the screen printing method. Then, the first to third upper connection pads 14a to 14c of the lower circuit substrate 11 are aligned with the connection pad portions of the first to third lower wiring lines 3a to 3c, such that the lower circuit substrate 11 is placed on the circuit substrate 1. In this state, the lower surface of the lower overcoat film 19 of the lower circuit substrate 11 is located lower than the lower surface of the silicon substrate 32 of the semiconductor construct 31.

Here, the first lower connection pad 15a of the lower circuit substrate 11 is connected to the connection pad 33 of the silicon substrate 32 via the first vertical conductor 16a, the first upper connection pad 14a, the first solder layer 21a, the first lower wiring line 3a, the columnar electrode 37 and the foundation metal layer 36. The third lower connection pad 15c is connected to the connection pad 33 of the silicon substrate 32 via the third vertical conductor 16c, the third upper connection pad 14c, the third solder layer 21c, the third lower wiring line 3c, the columnar electrode 37 and the foundation metal layer 36. Thus, in this state, a probe (not shown) is brought into contact with the first lower connection pad 15a and the third lower connection pad 15c of the lower circuit substrate 11, such that it is possible to inspect the mutual mounting state of the semiconductor construct 31, the lower circuit substrate 11 and the circuit substrate 1 and to inspect the operation and function of the integrated circuit unit incorporated in the semiconductor construct 31. In addition, such inspections of the mounting state and the operation/function can be carried out anytime in the subsequent steps.

Figure 6:
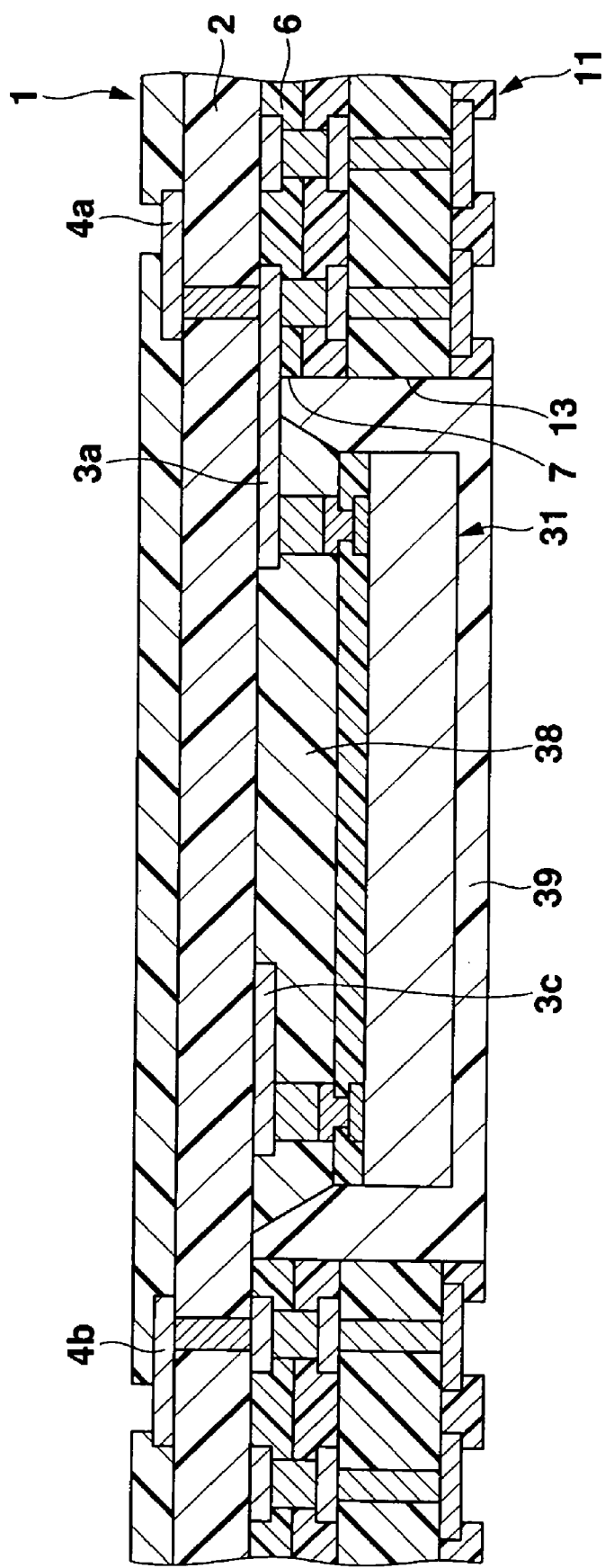
FIG. 6 is a sectional view of the assembly in a step following FIG. 5.

After the inspections of the mounting state and the operation/function have been finished, the sealing film 39 made of a thermosetting resin such as an epoxy-based resin is formed on the lower surfaces of the semiconductor construct 31, the underfill material 38, the first and third lower wiring lines 3a, 3c and the film substrate 2 within the opening 13 of the lower circuit substrate 11 and within the opening 7 of the lower overcoat film 6 of the circuit substrate 1 by, for example, an application method using a dispenser or the screen printing method, as shown in FIG. 6. In this case, the lower surface of the sealing film 39 is flush with or located higher than (recessed relative to) the lower surface of the lower overcoat film 19 of the lower circuit substrate 11.

Figure 7:
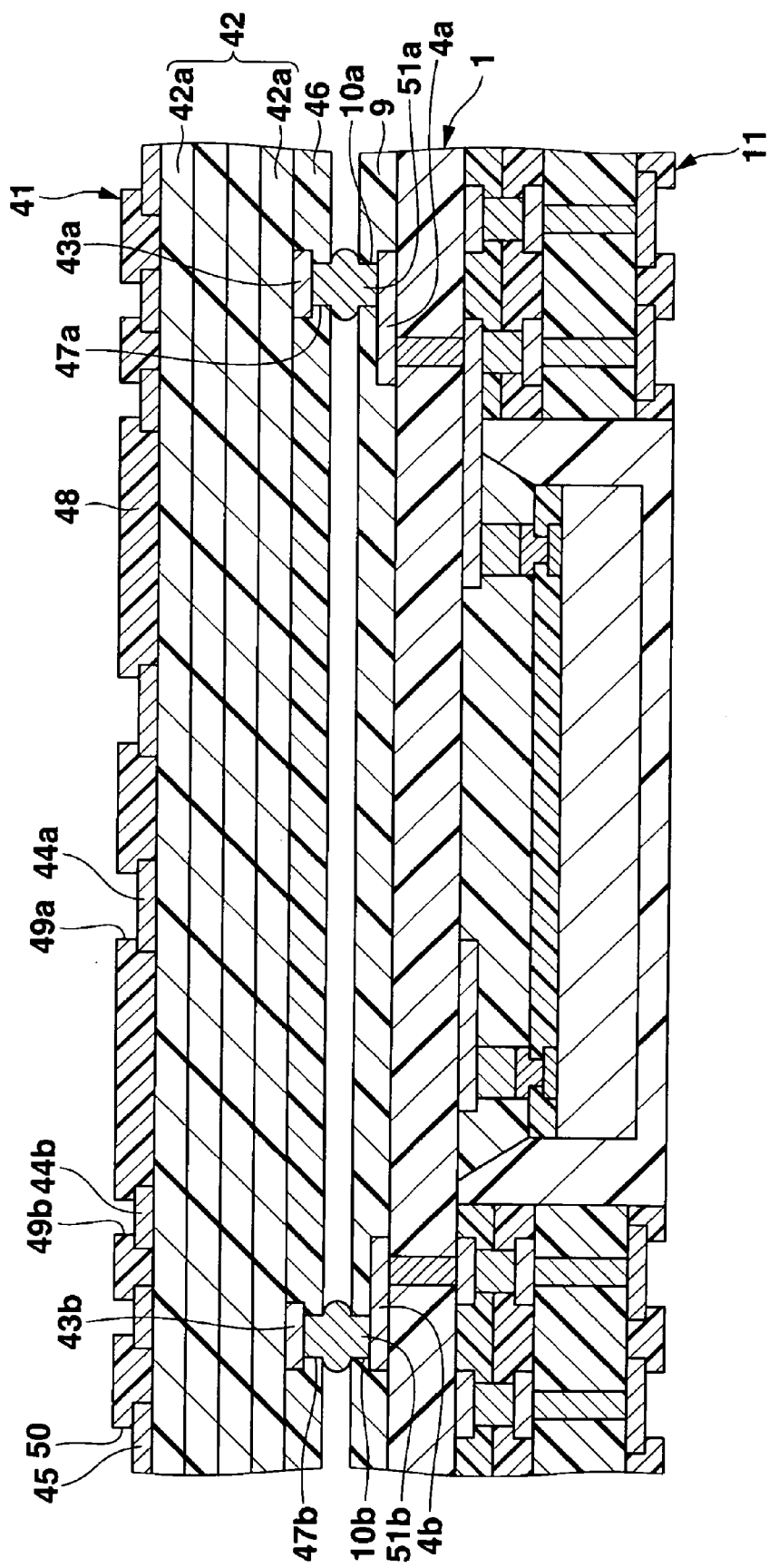
FIG. 7 is a sectional view of the assembly in a step following FIG. 6.

Then, as shown in FIG. 7, the upper circuit substrate 41 is prepared. In this case as well, the prepared upper circuit substrate 41 is sized so that a plurality of completed semiconductor devices shown in FIG. 1 can be formed. As described above, the upper circuit substrate 41 comprises the multilayer wiring substrate 42 having a multilayer wiring structure in which a plurality of wiring substrates 42a are stacked and which has the internal wiring lines therein. The first and second lower wiring lines 43a, 43b, the first and second upper wiring lines 44a, 44b and the ground wiring line 45 are formed on the lower and upper surfaces of the multilayer wiring substrate 42 by patterning stacked metal foils made of a metal such as a copper-based or aluminum-based metal.

The lower overcoat film 46 is formed on the lower surface of the multilayer wiring substrate 42 and on the surfaces of the first and second lower wiring lines 43a, 43b by the application of, for example, a solder resist through, for example, screen printing. The first and second openings 47a and 47b are formed in the lower overcoat film 46 in parts corresponding to connection pad portions of the first and second lower wiring lines 43a, 43b by, for example, laser processing based on laser irradiation.

The upper overcoat film 48 is formed on the upper surface of the multilayer wiring substrate 42 and on the surfaces of the first and second upper wiring lines 44a, 44b and the ground wiring line 45 by the application of, for example, a solder resist through, for example, screen printing. The first and second openings 49a and 49b and the opening 50 are formed in the upper overcoat film 48 in parts corresponding to the connection pad portions of the first and second upper wiring lines 44a, 44b and the outer peripheral portion of the ground wiring line 45 by, for example, laser processing based on laser irradiation.

Now, after the upper circuit substrate 41 has been prepared, the first and second lower wiring lines 43a, 43b of the upper circuit substrate 41 are joined to the connection pad portions of the first and second upper wiring lines 4a, 4b of the circuit substrate 1 via the first and second solders 51a, 51b provided in the parts of the first and second openings 47a, 47b of the lower overcoat film 46 of the upper circuit substrate 41 or in the parts of the first and second openings 10a, 10b of the upper overcoat film 9 of the circuit substrate 1, such that the upper circuit substrate 41 is disposed on the upper surface of the upper overcoat film 9 of the circuit substrate 1, as shown in FIG. 7.

In order to join the first and second lower wiring lines 43a, 43b of the upper circuit substrate 41 to the connection pad portions of the first and second upper wiring lines 4a, 4b of the circuit substrate 1, the reflow method which carries out soldering with a solder reflow device can be applied. For example, the circuit substrate 1 on which the semiconductor construct 31 is installed is disposed so that its surface having the first and second upper wiring lines 4a, 4b is directed upward, as shown in FIG. 6. The solder layers are deposited on the connection pad portions of the first and second upper wiring lines 4a, 4b of the circuit substrate 1 by, for example, the screen printing method. Then, the connection pad portions of the first and second lower wiring lines 43a, 43b of the upper circuit substrate 41 are aligned with the connection pad portions of the first and second upper wiring lines 4a, 4b, such that the upper circuit substrate 41 is placed on the circuit substrate 1.

Figure 8:
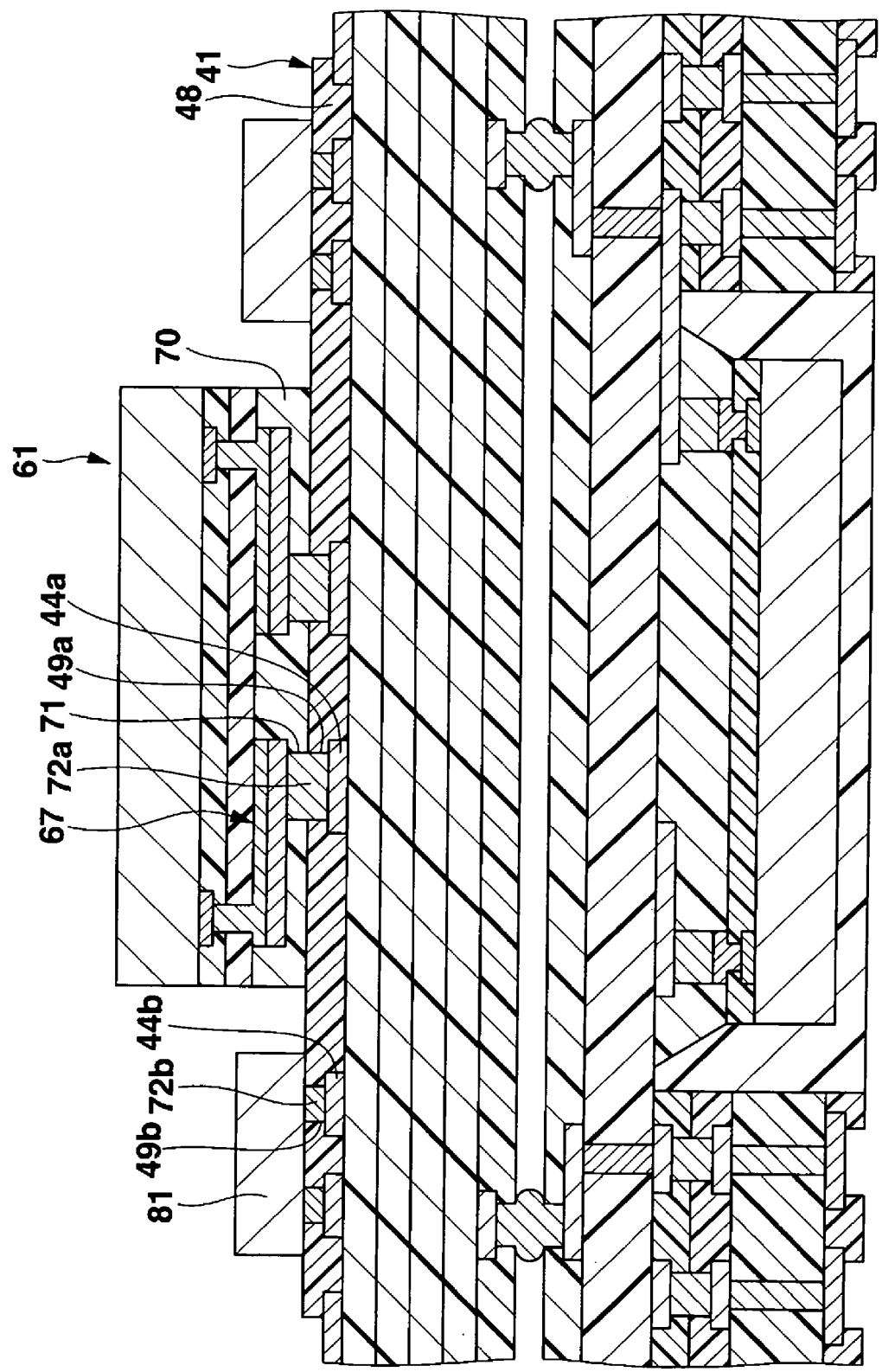
FIG. 8 is a sectional view of the assembly in a step following FIG. 7.

Then, as shown in FIG. 8, the connection pad portions of the wiring line 67 of the semiconductor construct 61 are joined to the connection pad portions of the first upper wiring lines 44a of the upper circuit substrate 41 via first solder layers 72a provided in the openings 71 of the overcoat film 70 of the semiconductor construct 61 and in the first openings 49a of the upper overcoat film 48 of the upper circuit substrate 41, such that the semiconductor construct 61 is installed face down in the center of the upper surface of the upper overcoat film 48 of the upper circuit substrate 41.

Both electrodes (not shown) of the chip components 81 are joined to the connection pad portions of the second upper wiring lines 44b of the upper circuit substrate 41 via the second solder layers 72b provided in the second openings 49b of the upper overcoat film 48 of the upper circuit substrate 41, such that the chip components 81 are installed in the peripheral portions of the upper surface of the upper overcoat film 48 of the upper circuit substrate 41. The above-mentioned reflow method can be applied to simultaneously install the semiconductor construct 61 and the chip components 81 on the upper circuit substrate 41. The upper circuit substrate 41 may be disposed on the circuit substrate 1 after the semiconductor construct 61 and the chip components 81 have been installed on the upper circuit substrate 41.

Thus, the circuit substrate 1 has already been installed on the lower circuit substrate 11 in the situation where the upper circuit substrate 41 is installed on the circuit substrate 1 and the semiconductor construct 61 and the chip components 81 are installed on the upper circuit substrate 41. Therefore, as shown in FIG. 2, the external-connection connection pad 15a(2) is connected to the semiconductor construct 61 via the first solder 51a, the connection pad portion of the first lower wiring line 43a and the connection pad portion of first upper wiring line 44a, and the external-connection connection pad 15b(2) is connected to the semiconductor construct 61 via the second solder 51b, the connection pad portion of the second lower wiring line 43b and the connection pad portion of second upper wiring line 44b. Moreover, the external-connection connection pad 15b(1) is connected to the chip component 81 via the second solder 51b, the connection pad portion of the second lower wiring line 43b and the connection pad portion of second upper wiring line 44b. Further, the semiconductor construct 31 and the semiconductor construct 61 are connected to each other via the lower wiring line 3d provided in the lower circuit substrate 11, the vertical conductor 5d, the upper wiring line 4d and the lower wiring line 43d.

Therefore, a probe (not shown) is brought into contact with the first lower connection pad 15a and the second lower connection pad 15b of the lower circuit substrate 11, such that it is possible to inspect the mutual mounting state of the semiconductor construct 61, the chip component 81, the upper circuit substrate 41 and the circuit substrate 1 and to inspect the operation and function of the integrated circuit unit incorporated in the semiconductor construct 61. Moreover, in such a state, it is also possible to inspect the mutual mounting state of the semiconductor construct 31, the lower circuit substrate 11 and the circuit substrate 1 and to inspect the operation and function of the integrated circuit unit incorporated in the semiconductor construct 31. That is, in the condition where all the circuit substrates and electronic components are mounted, it is possible to selectively inspect the mutual mounting state of all the circuit components, the operations and functions of the integrated circuit units incorporated in all the semiconductor constructs, the mutual mounting state of particular circuit components, or the operation and function of the integrated circuit unit incorporated in each of the semiconductor constructs.

Figure 9:
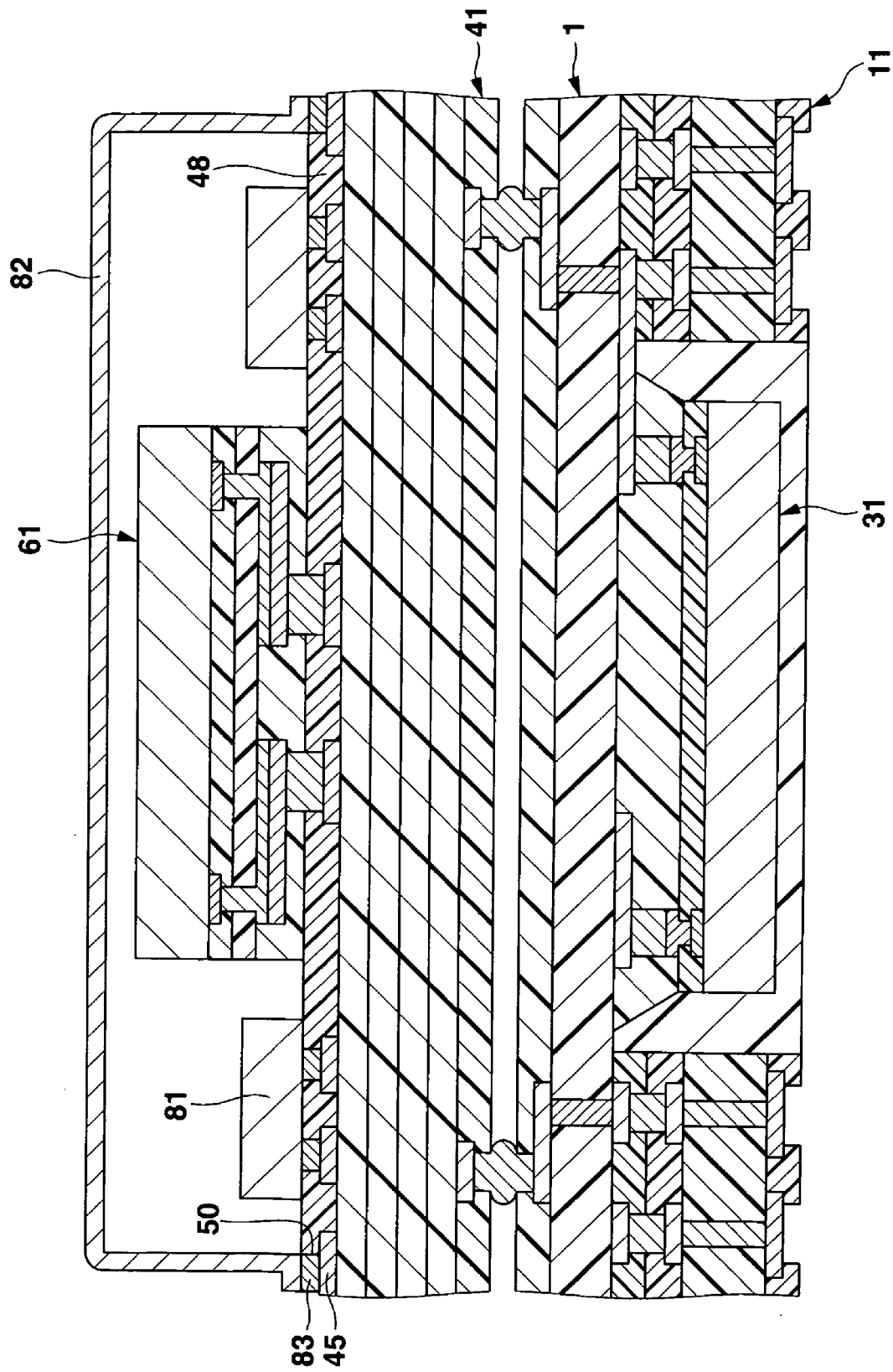
FIG. 9 is a sectional view of the assembly in a step following FIG. 8.

Then, as shown in FIG. 9, the lower end of the shield cover 82 made of a metal is joined via the solder layer 83 to the upper surface of the outer peripheral portion of the ground wiring line 45 exposed via the opening 50 of the upper overcoat film 48 of the upper circuit substrate 41, thereby covering the semiconductor construct 61 and the chip components 81 constituting the analog system circuit unit with the shield cover 82. Subsequently, the upper circuit substrate 41, the circuit substrate 1 and the lower circuit substrate 11 are cut off between the adjacent semiconductor constructs 31, 61, such that a plurality of semiconductor devices shown in FIG. 1 can be obtained.

Second Embodiment

Figure 10:
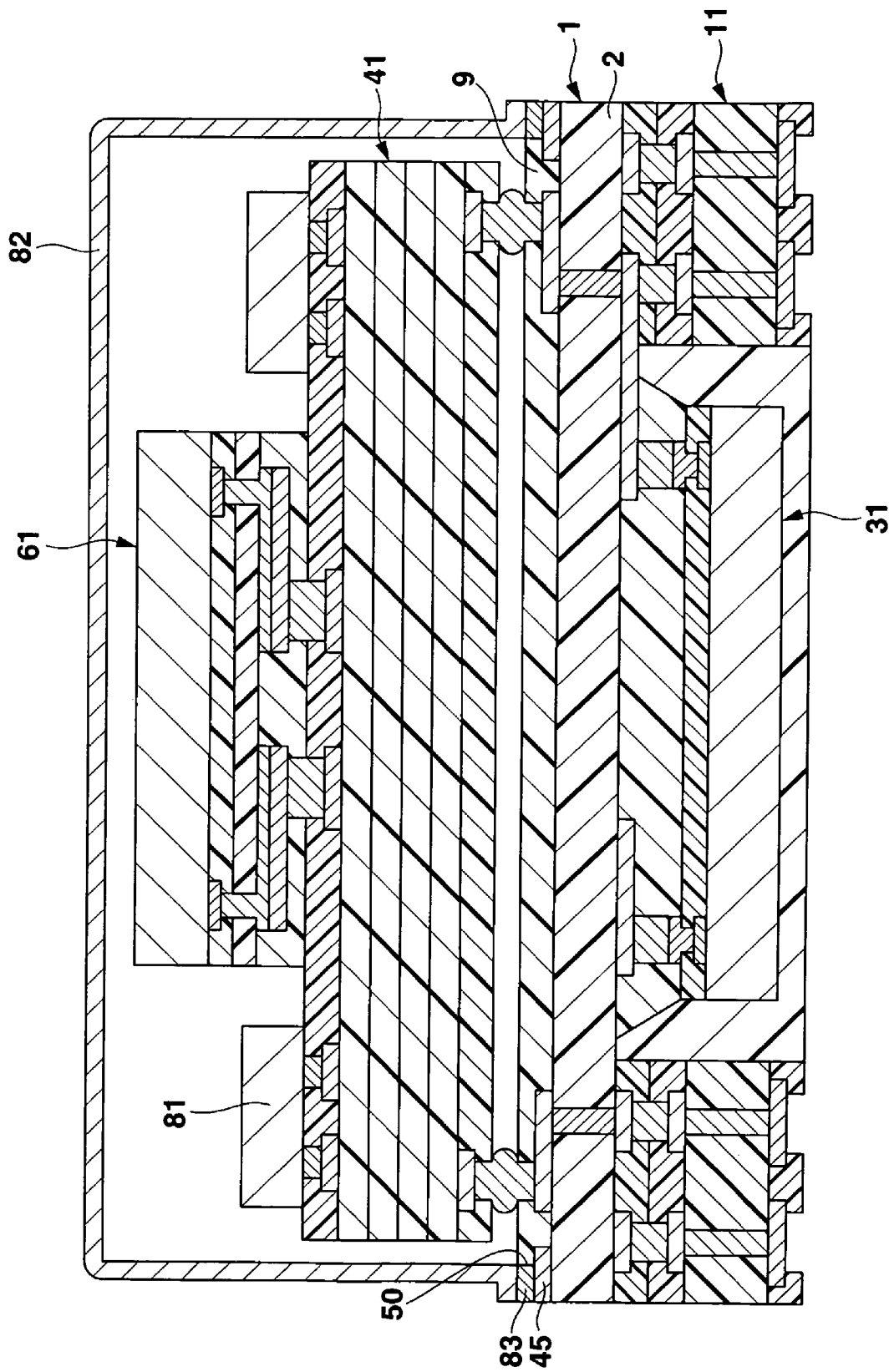
FIG. 10 is a sectional view of a semiconductor device as a second embodiment of this invention.

FIG. 10 shows a sectional view of a semiconductor device as a second embodiment of this invention. This semiconductor device is different from the semiconductor device shown in FIG. 1 in that the planar size of an upper circuit substrate 41 is slightly smaller than the planar size of a circuit substrate 1, and in that a square frame-shaped ground wiring line 45 is provided in the peripheral portion of the upper surface of a film substrate 2 of the circuit substrate 1, and the lower end of a shield cover 82 is joined via a solder layer 83 to the upper surface of the outer peripheral portion of the ground wiring line 45 exposed via an opening 50 provided in the outer peripheral portion of an upper overcoat film 9, so that the upper circuit substrate 41, a semiconductor construct 61 and chip components 81 are covered with the shield cover 82.

In such a case, as the upper circuit substrate 41 on which the semiconductor construct 61 and the chip components 81 constituting an analog system circuit unit are installed is covered with the shield cover 82, it is possible to further reduce the disturbance of noise which is emitted from a semiconductor construct 31 configuring a digital system circuit unit and which is caused to the semiconductor construct 61 and the chip components 81 constituting the analog system circuit unit.

In a manufacturing method in this case, a single upper circuit substrate 41 (or a single upper circuit substrate 41 on which the semiconductor construct 61 and the chip components 81 are installed) shown in FIG. 10 obtained by cutting may be disposed on a large-sized circuit substrate 1 before cut in a step as shown in FIG. 7. Alternatively, after the step as shown in FIG. 7, a large-sized upper circuit substrate 41 may be cut by, for example, router processing to obtain single upper circuit substrates 41.

Third Embodiment

Figure 11:
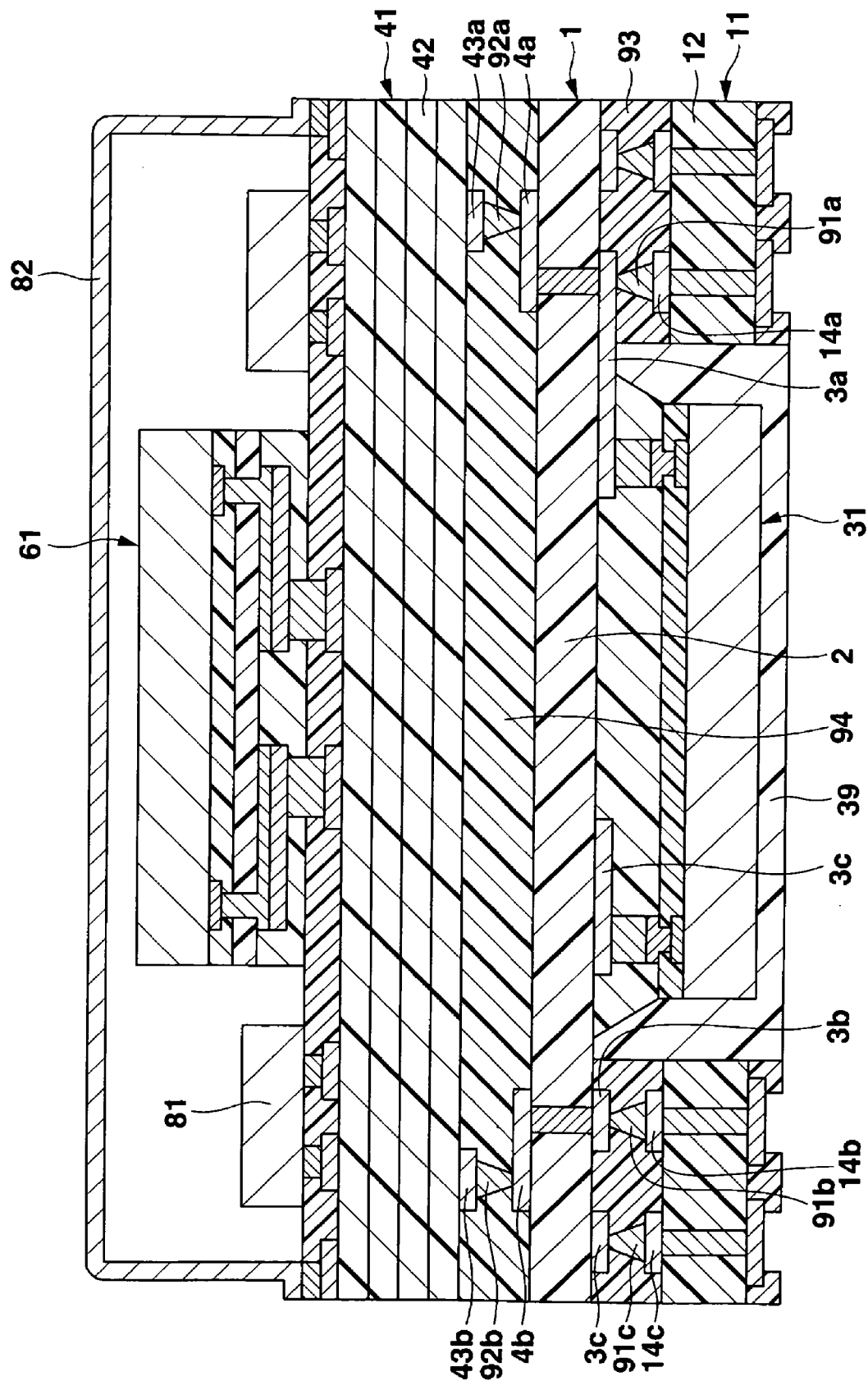
FIG. 11 is a sectional view of a semiconductor device as a third embodiment of this invention.

FIG. 11 is a sectional view of a semiconductor device as a third embodiment of this invention. This semiconductor device is greatly different from the semiconductor device shown in FIG. 1 in that the upper ends of first to third head-cut conical projecting electrodes 91a to 91c provided on the upper surfaces of first to third upper connection pads 14a to 14c of a lower circuit substrate 11 are connected to the lower surfaces of the connection pad portions of first to third lower wiring lines 3a to 3c of a circuit substrate 1, and the lower ends of first and second head-cut conical projecting electrodes 92a, 92b provided on the lower surfaces of first and second lower wiring lines 43a, 43b of an upper circuit substrate 41 are connected to the upper surfaces of the connection pad portions of first and second upper wiring lines 4a, 4b of the circuit substrate 1, without using solders 21a to 21c, 51a, 51b.

In this case, a square frame-shaped lower insulating film 93 is provided between a film substrate 2 including the first to third lower wiring lines 3a to 3c and a substrate 12 including the first to third upper connection pads 14a to 14c and the first to third projecting electrodes 91a to 91c. Moreover, an upper insulating film 94 is provided between the upper surface of the film substrate 2 on which the first and second upper wiring lines 4a, 4b are formed and a multilayer wiring substrate 42 on which the first and second lower wiring lines 43a, 43b are formed. In this case, the first projecting electrode 92a connecting the first lower wiring line 43a to the first upper wiring line 4a and the second projecting electrodes 92b connecting the second lower wiring line 43b to the second upper wiring line 4b are embedded in the upper insulating film 94.

Figure 12:
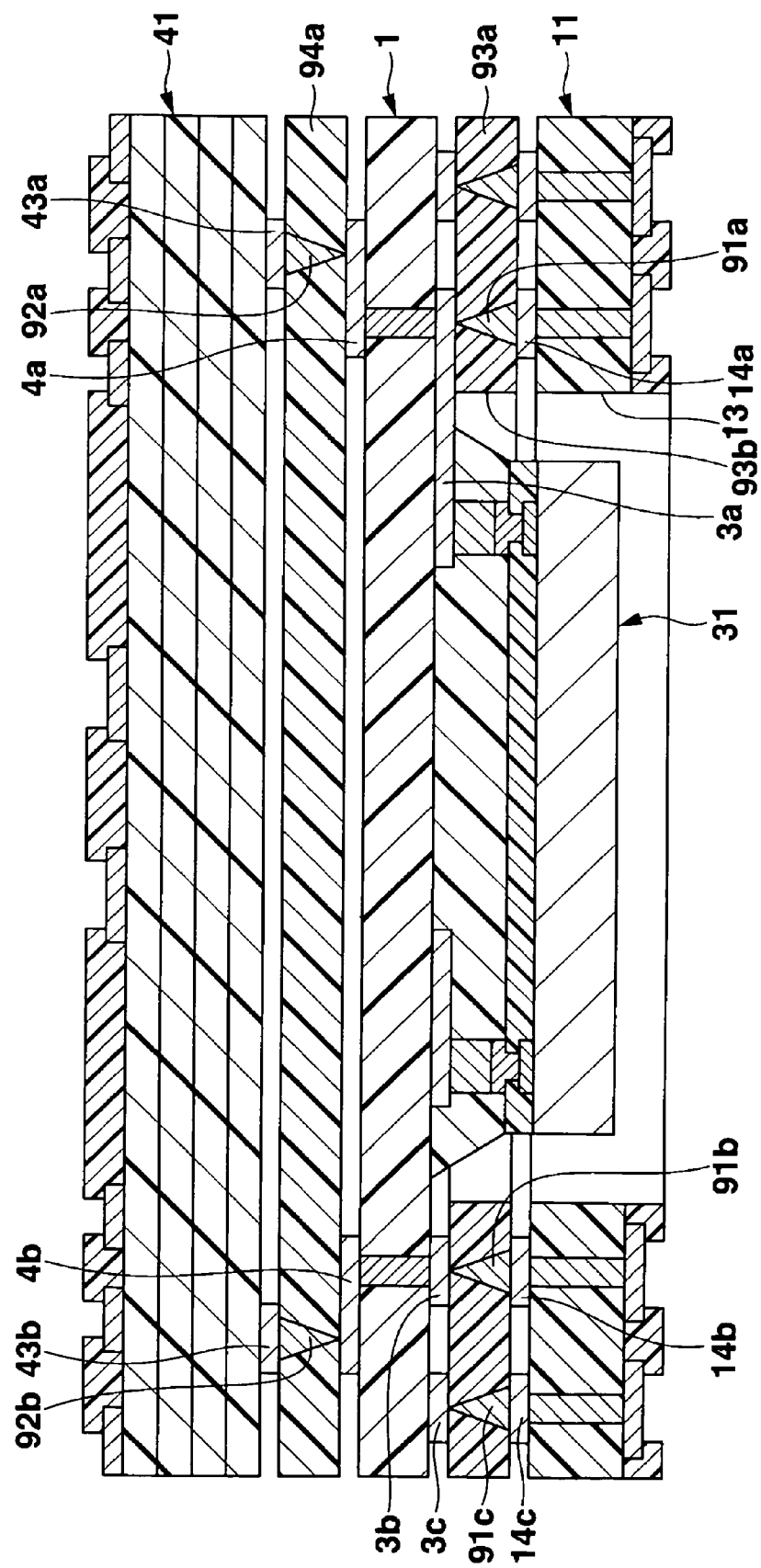
FIG. 12 is a sectional view of an assembly in a predetermined step in one example of a method for manufacturing the semiconductor device shown in FIG. 11.

Next, one example of a method for manufacturing this semiconductor device is described. First, as shown in FIG. 12, a lower insulating film formation sheet 93a and an upper insulating film formation sheet 94a are prepared in addition to the lower circuit substrate 11 and the upper circuit substrate 41, after a step shown in FIG. 4. In this case, the conical first, second and third projecting electrodes 91a, 91b, 91c and first and second projecting electrodes 92a, 92b made of a conductive paste in which, for example, metal fillers are dispersed in a thermosetting resin by, for example, screen printing are formed on the upper surfaces of the connection pad portions of the first, second and third upper wiring lines 3a, 3b, 3c of the lower circuit substrate 11 and on the lower surfaces of the connection pad portions of the first and second lower wiring lines 43a, 43b of the upper circuit substrate 41. The projecting electrodes 91a, 91b, 91c, 92a, 92b are formed by applying the conductive paste in which, for example, the metal fillers are dispersed onto the connection pads of the wiring lines 3a, 3b, 3c, 43a, 43b in accordance with a method such as the screen printing and then drying and curing the conductive paste.

The lower insulating film formation sheet 93a and the upper insulating film formation sheet 94a are produced by impregnating a thermosetting resin such as an epoxy-based resin into a base material made of, for example, glass fabric and semi-curing the thermosetting resin into a sheet shape. In this case, a plurality of square openings 93b are formed in the lower insulating film formation sheet 93a by, for example, punching. Here, while the lower insulating film formation sheet 93a is being heated, the lower insulating film formation sheet 93a is connected through pressure to the lower circuit substrate 11, and the conical first to third projecting electrodes 91a to 91c are stuck into the lower insulating film formation sheet 93a, such that the lower insulating film formation sheet 93a is temporarily fixedly connected to the upper surface side of the lower circuit substrate 11. In the same manner, the upper insulating film formation sheet 94a is temporarily fixedly connected to the lower surface side of the upper circuit substrate 41.

Now, after the above components have been prepared, the circuit substrate 1 is positioned by, for example, pins and disposed on the upper surface of the lower insulating film formation sheet 93a temporarily fixedly connected to the upper surface side of the lower circuit substrate 11, as shown in FIG. 12. In this state, a semiconductor construct 31 installed on the lower surface of the lower circuit substrate 11 is disposed in openings 13, 93b of the lower circuit substrate 11 and the lower insulating film formation sheet 93a. Moreover, the upper circuit substrate 41 and the upper insulating film formation sheet 94a temporarily fixedly connected to the lower surface side of the upper circuit substrate 41 are positioned by, for example, pins and disposed on the upper surface of the circuit substrate 1.

Figure 13:
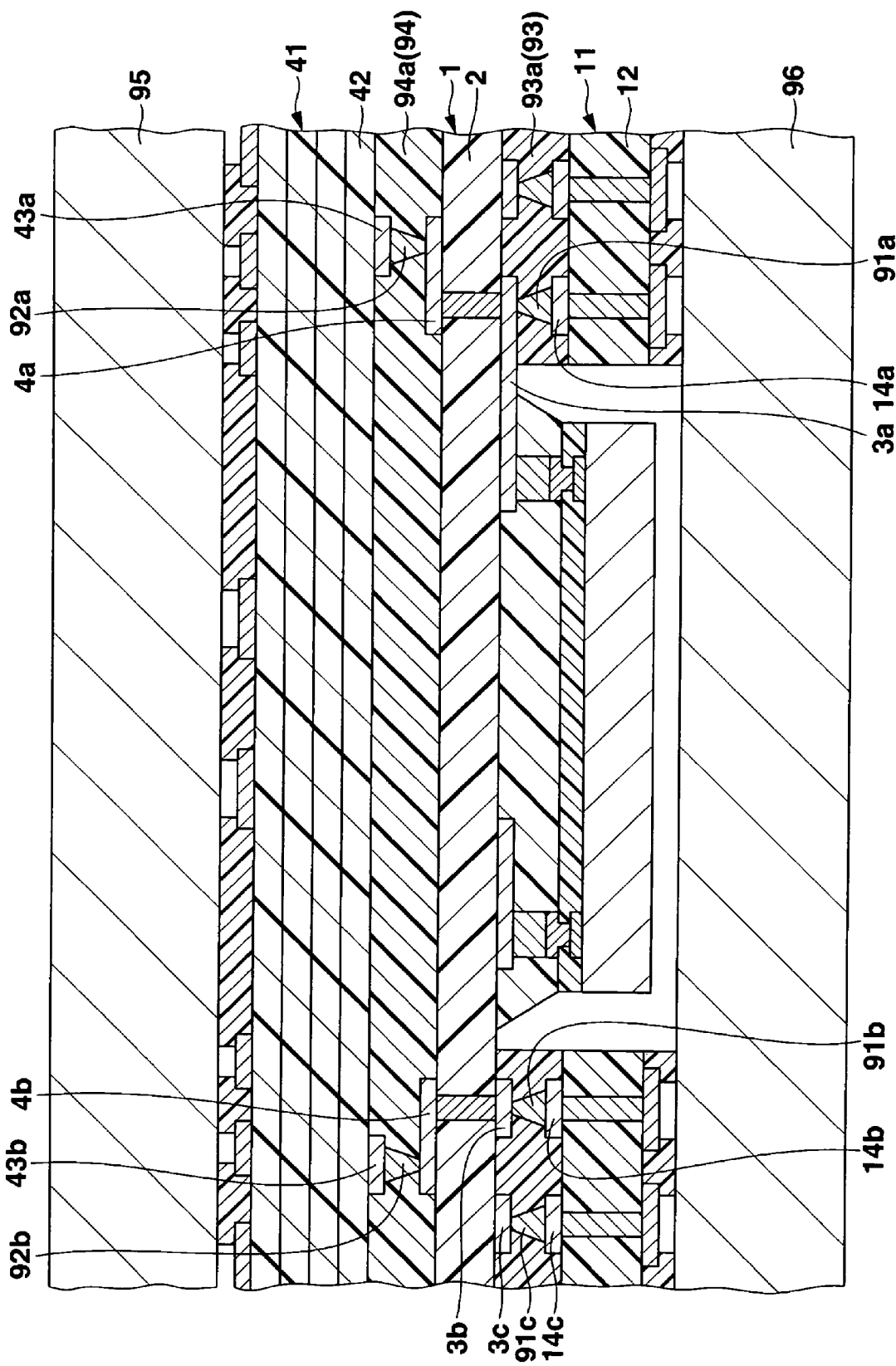
FIG. 13 is a sectional view of the assembly in a step following FIG. 12.

Then, as shown in FIG. 13, both the insulating film formation sheets 93a, 94a are hot-pressed from the upper and lower sides at a temperature equal to or more than the cure temperature using a pair of hot press plates 95, 96. The lower insulating film formation sheet 93a is melted by this hot press and cured by the subsequent cooling, such that the lower insulating film 93 is fixedly connected to the lower surface of the circuit substrate 1 which has the first to third lower wiring lines 3a to 3c on its lower surface, and the lower circuit substrate 11 having the first to third upper wiring lines 14a to 14c formed on its upper surface is fixedly connected to the lower surface of the lower insulating film 93.

Furthermore, the upper insulating film formation sheet 94a is melted by the above hot press and cured by the subsequent cooling, such that the upper insulating film 94 is formed on the upper surface of the film substrate 2 including the first and second upper wiring lines 4a, 4b of the circuit substrate 1 and the lower surface of the multilayer wiring substrate 42 including the first and second lower wiring lines 43a, 43b of the upper circuit substrate 41 is fixedly connected to the upper surface of the upper insulating film 94.

Still further, the upper parts of the first to third projecting electrodes 91a to 91c are pressed against the lower surfaces of the connection pad portions of the first to third lower wiring lines 3a to 3c and properly crushed by the above hot press, and the first to third projecting electrodes 91a to 91c are connected to the lower surfaces of the connection pad portions of the first to third lower wiring lines 3a to 3c. Moreover, the lower parts of the first and second projecting electrodes 92a, 92b are pressed against the upper surfaces of the connection pad portions of the first and second upper wiring lines 4a, 4b and properly crushed by the above hot press, and the first and second projecting electrodes 92a, 92b are connected to the lower surfaces of the connection pad portions of the first and second upper wiring lines 4a, 4b.

Subsequently, as in the first embodiment described above, a plurality of semiconductor devices shown in FIG. 11 are obtained after the step of forming a sealing film 39, the step of installing a semiconductor construct 61 and chip components or electronic components 81, the step of disposing a shield cover 82 and the step of cutting. In addition, by a first hot press, the lower insulating film 93 may be formed on the lower surface of the circuit substrate 1, and the lower circuit substrate 11 may be fixedly connected to the lower surface of the lower insulating film 93, and then the sealing film 39 may be formed. Then, by a second hot press, the upper insulating film 94 may be formed on the upper surface of the circuit substrate 1, and the upper circuit substrate 41 may be fixedly connected to the upper surface of the upper insulating film 94.

Fourth Embodiment

Figure 14:
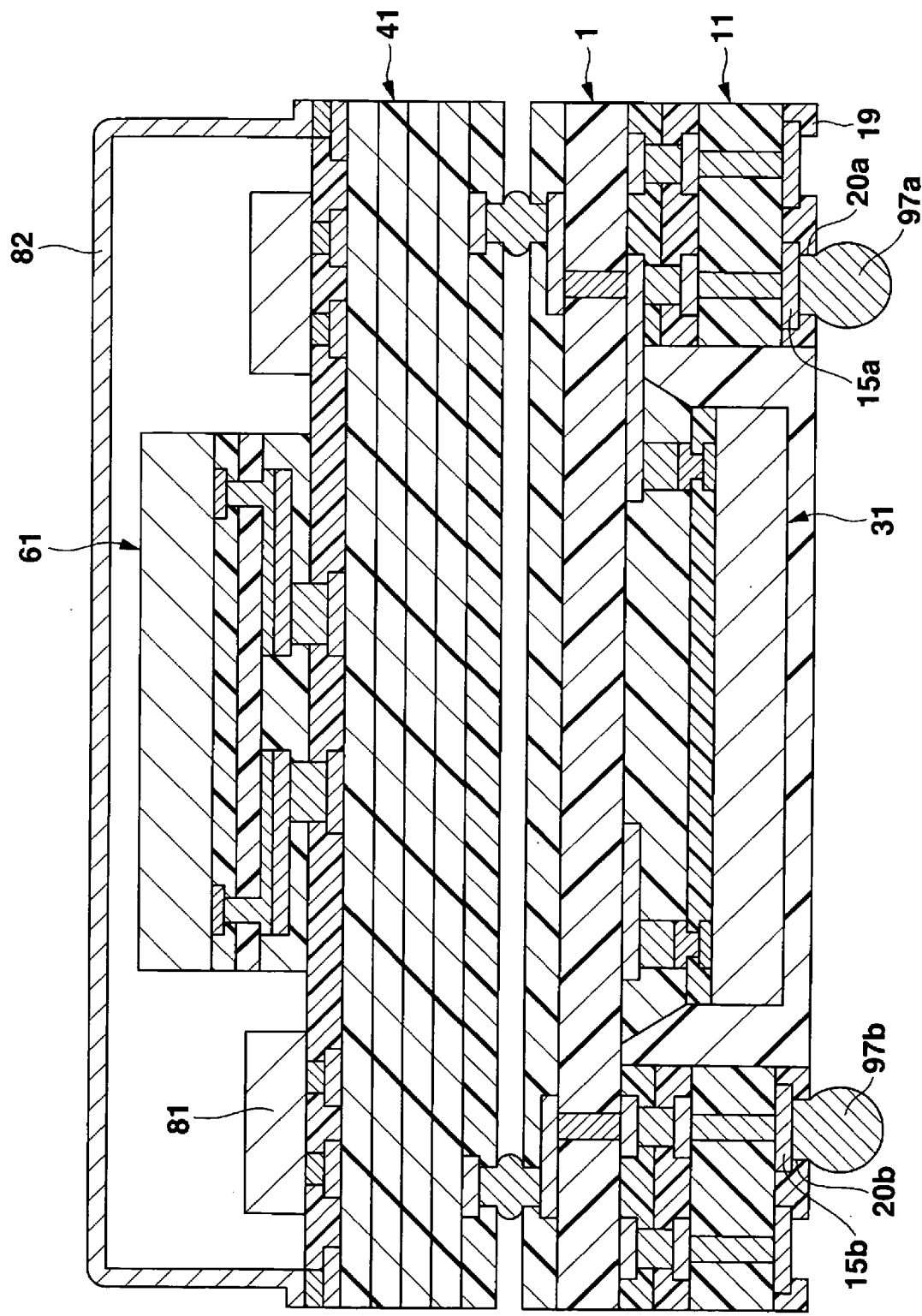
FIG. 14 is a sectional view of a semiconductor device as a fourth embodiment of this invention.

FIG. 14 shows a sectional view of a semiconductor device as a fourth embodiment of this invention. This semiconductor device is different from the semiconductor device shown in FIG. 1 in that solder balls 97a, 97b are provided in and under first and second openings 20a, 20b of a lower overcoat film 19 of a lower circuit substrate 11 so that the solder balls are connected to first and second lower connection pads 15a, 15b.

In addition, the semiconductor construct 61 and the electronic components such as the chip components 81 are installed on the circuit substrate 1 via the upper circuit substrate 41 in the configurations of the embodiments described above. However, the invention of the present application is not limited to this, and is also applicable to a case where the upper circuit substrate 41 alone is installed on the circuit substrate 1 or to a case where the electronic components alone are installed on the circuit substrate 1. Further, the upper circuit substrate 41 is not limited to the multilayer wiring substrate, and may be a single layer wiring substrate. Still further, the joining of the circuit substrate 1, the lower circuit substrate 11 and the upper circuit substrate 41 is not limited to the method wherein the joining is carried out after each of the circuit substrates has been formed as a large-sized substrate from which a plurality of final semiconductor devices are obtained as described above. The joining may be carried out after all or some of the circuit substrates have been cut into final sizes.

Moreover, the opening 13 provided in the lower circuit substrate 11 to receive the semiconductor construct 31 is not limited to the square shape, and may be round or may be shaped to communicate with the outside on a predetermined side. In short, the opening 13 has only to receive the semiconductor construct 31. Further, it is possible to properly change, for example, the structure and number of the semiconductor constructs or the structure and the number of layers of the circuit substrates and apply the same. Modifications can be made without departing from the sprit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
a first circuit substrate having a plurality of lower wiring lines and a plurality of upper wiring lines on a lower surface side and an upper surface side thereof, respectively;
a second circuit substrate provided on a lower side of the first circuit substrate, wherein the second circuit substrate has an opening which exposes a part of the first circuit substrate, and the second circuit substrate also has, on a lower surface side thereof, a plurality of external-connection connection pads and a plurality of test connection pads connected to the lower wiring lines;
a first semiconductor construct which is disposed on the lower side of the first circuit substrate within the opening of the second circuit substrate, the first semiconductor construct having a plurality of external connection electrodes connected to lower wiring lines of the first circuit substrate;
a third circuit substrate provided on an upper side of the first circuit substrate and having a plurality of lower wiring lines connected to the upper wiring lines of the first circuit substrate; and at least one of an electronic component and a second semiconductor construct which is provided on the third circuit substrate and which is connected to a plurality of upper wiring lines of the third circuit substrate, wherein said plurality of test connection pads include at least a first inspection connection pad which is configured to inspect the first semiconductor construct.

2. The semiconductor device according to claim 1, wherein:

the first semiconductor construct includes a semiconductor substrate provided with an integrated circuit unit, and a plurality of connection pads provided on the semiconductor substrate, and the test connection pads of the second circuit substrate include at least a second inspection connection pad to inspect the integrated circuit unit of the semiconductor substrate.

3. The semiconductor device according to claim 1, wherein:

the first semiconductor construct has a semiconductor substrate provided with an integrated circuit unit, and a plurality of connection pads provided on the semiconductor substrate, and at least said first inspection connection pad inspects the integrated circuit unit of the semiconductor substrate.

4. The semiconductor device according to claim 1, wherein:

the first semiconductor construct includes a semiconductor substrate provided with an integrated circuit unit, and a plurality of connection pads which are provided on the semiconductor substrate and which configure the external connection electrodes, and the plurality of test connection pads of the second circuit substrate include at least one mounting inspection connection pad to inspect a mounting state of the first circuit substrate and the first semiconductor construct and a mounting state of the first circuit substrate and the second circuit substrate, and wherein at least said first inspection connection pad inspects the integrated circuit unit of the semiconductor substrate.

5. The semiconductor device according to claim 1, wherein the external connection electrodes provided on an upper side of the first semiconductor construct are connected to the lower wiring lines of the first circuit substrate such that the external connection electrodes are installed face down under the first circuit substrate.

6. The semiconductor device according to claim 1, further comprising an underfill material provided between the first semiconductor construct and the first circuit substrate.

7. The semiconductor device according to claim 1, wherein a lower surface of the second circuit substrate is located at a position projecting further than a lower surface of the first semiconductor construct.

8. The semiconductor device according to claim 7, wherein a sealing film covering the first semiconductor construct is provided under the first circuit substrate within the opening of the second circuit substrate so that a lower surface of the sealing film is flush with or located at a position recessed relative to the lower surface of the second circuit substrate.

9. The semiconductor device according to claim 1, wherein the second circuit substrate has a lower overcoat film having openings in parts corresponding to the external-connection connection pads and the test connection pads.

10. The semiconductor device according to claim 9, wherein solder balls are provided in and under some of the openings of the lower overcoat film so that the solder balls are connected to the external-connection connection pads.

11. The semiconductor device according to claim 1, wherein the electronic component is provided on the third circuit substrate so that the electronic component is connected to the upper wiring lines of the third circuit substrate.

12. The semiconductor device according to claim 11, wherein the test connection pads of the second circuit substrate include at least second inspection connection pads to inspect a mounting state of the third circuit substrate and the electronic component, a mounting state of the third circuit substrate and the first circuit substrate and a mounting state of the first circuit substrate and the second circuit substrate.

13. The semiconductor device according to claim 11, wherein the third circuit substrate has a multilayer wiring structure.

14. The semiconductor device according to claim 11, wherein the test connection pads of the second circuit substrate include test connection pads to inspect a mounting state of the third circuit substrate and the second semiconductor construct, a mounting state of the third circuit substrate and the first circuit substrate and a mounting state of the first circuit substrate and the second circuit substrate.

15. The semiconductor device according to claim 14, wherein the test connection pads of the second circuit substrate include inspection test connection pads to inspect an integrated circuit unit of the second semiconductor construct.

16. The semiconductor device according to claim 14, wherein the test connection pads include inspection test connection pads to inspect an integrated circuit unit of the first semiconductor construct.

17. The semiconductor device according to claim 11, wherein the first semiconductor construct configures a digital circuit unit, and the electronic component configures an analog circuit unit.

18. The semiconductor device according to claim 17, wherein a shield cover covering the electronic component is provided over the third circuit substrate.

19. The semiconductor device according to claim 17, wherein a shield cover covering the third circuit substrate and the electronic component is provided over the first circuit substrate.

20. A semiconductor device comprising:

a first circuit substrate having a plurality of lower wiring lines with connection pad portions and a plurality of upper wiring lines;

a first semiconductor construct having an integrated circuit unit, and a plurality of external connection electrodes connected to connection pad portions of lower wiring lines of the first circuit substrate;

a second circuit substrate provided under the first circuit substrate, wherein the second circuit substrate has an opening which receives the first semiconductor construct, and the second circuit substrate has a plurality of external-connection connection pads and a plurality of test connection pads connected to the lower wiring lines;

a third circuit substrate provided over the first circuit substrate, wherein the third circuit substrate has an integrated circuit unit, a plurality of upper wiring lines and a plurality of lower wiring lines connected to the upper wiring lines of the first circuit substrate; and a second semiconductor construct provided on the third circuit substrate and having a plurality of wiring lines connected to the upper wiring lines of the third circuit substrate, wherein the test connection pads of the second circuit substrate include first inspection connection pads which are configured to inspect operation of the integrated circuit unit of the first semiconductor construct, and second inspection connection pads which are configured to inspect operation of an integrated circuit unit of the second semiconductor construct.

21. The semiconductor device according to claim 20, wherein the test connection pads of the second circuit substrate include at least one mounting inspection connection pad to inspect a mounting state of the second circuit substrate mounted on the first circuit substrate, at least one mounting inspection connection pad to inspect a mounting state of the third circuit substrate mounted on the first circuit substrate, and at least one inspection test connection pad to inspect a mounting state of the second semiconductor construct mounted on the third circuit substrate.

22. The semiconductor device according to claim 20, further comprising at least one electronic component mounted on the third circuit substrate and connected to upper wiring lines of the third circuit substrate, and wherein the test connection pads of the second circuit substrate include at least one mounting inspection connection pad to inspect a mounting state of the electronic component mounted on the third circuit substrate.

* * * * *